(12) United States Patent  
Yamazaki et al.

(10) Patent No.: US 7,067,926 B2
(45) Date of Patent: Jun. 27, 2006

(54) SEMICONDUCTOR CHIP AND METHOD FOR MANUFACTURING THE SAME

(75) Inventors: Shunpei Yamazaki, Tokyo (JP); Toru Takayama, Kanagawa (JP); Junya Maruyama, Kanagawa (JP); Yumiko Ohno, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 10/730,047

(22) Filed: Dec. 9, 2003

(65) Prior Publication Data

US 2004/0140547 A1    Jul. 22, 2004

(30) Foreign Application Priority Data

Dec. 19, 2002    (JP) ............................. 2002-368947

(51) Int. Cl.
*H01L 23/02* (2006.01)
(52) U.S. Cl. ........................ 257/777; 257/686
(58) Field of Classification Search ................ 257/686, 257/777, 701, 705, 707
See application file for complete search history.

(56) References Cited

U.S. PATENT DOCUMENTS

| 5,206,749 A | 4/1993 | Zavracky et al. |
| 5,317,236 A | 5/1994 | Zavracky et al. |
| 5,376,561 A | 12/1994 | Vu et al. |
| 5,804,872 A | 9/1998 | Miyano et al. |
| 5,821,138 A | 10/1998 | Yamazaki et al. |
| 5,834,327 A | 11/1998 | Yamazaki et al. |
| 5,861,666 A * | 1/1999 | Bellaar ........................ 257/686 |
| 6,043,800 A | 3/2000 | Spitzer et al. |
| 6,118,502 A | 9/2000 | Yamazaki et al. |
| 6,127,199 A | 10/2000 | Inoue et al. |
| 6,133,626 A | 10/2000 | Hawke et al. |
| 6,208,521 B1 | 3/2001 | Nakatsuka |
| 6,242,758 B1 | 6/2001 | Yamazaki et al. |
| 6,258,623 B1 | 7/2001 | Moden et al. |
| 6,265,772 B1 | 7/2001 | Yoshida |
| 6,312,304 B1 | 11/2001 | Duthaler et al. |
| 6,372,608 B1 | 4/2002 | Shimoda et al. |
| 6,376,333 B1 | 4/2002 | Yamazaki et al. |
| 6,388,652 B1 | 5/2002 | Yamazaki et al. |
| 6,423,614 B1 | 7/2002 | Doyle |
| 6,441,474 B1 | 8/2002 | Naitoh et al. |
| 6,506,681 B1 | 1/2003 | Grigg et al. |

(Continued)

FOREIGN PATENT DOCUMENTS

EP    0 858 110 A1    8/1998

(Continued)

OTHER PUBLICATIONS

Itsuo Watanabe et al.; "Anisotropic Conductive Films for Flat Panel Displays"; *IDW '96*; pp. 369-372; 1996.

(Continued)

*Primary Examiner*—Roy Potter
(74) *Attorney, Agent, or Firm*—Fish & Richardson P.C.

(57) ABSTRACT

A semiconductor chip having a plurality of device formative layers that are formed into an integrated thin film is provided by a technique for transferring. According to the present invention, a semiconductor chip that is formed into a thin film and that is highly integrated can be manufactured by transferring a device formative layer with a thickness of at most 50 μm which is separated from a substrate into another substrate by a technique for transferring, and transferring another device formative layer with a thickness of at most 50 μm which is separated from another substrate to the above device formative layer, and, repeating such transferring process.

22 Claims, 18 Drawing Sheets

U.S. PATENT DOCUMENTS

| | | |
|---|---|---|
| 6,589,811 B1 | 7/2003 | Sayyah |
| 6,677,621 B1 | 1/2004 | Yamazaki et al. |
| 6,737,300 B1 | 5/2004 | Ding et al. |
| 6,780,677 B1 | 8/2004 | Imasu et al. |
| 6,883,934 B1 | 4/2005 | Kawakami et al. |
| 6,946,361 B1 | 9/2005 | Takayama et al. |
| 2002/0030189 A1 | 3/2002 | Ishikawa |
| 2002/0131007 A1 | 9/2002 | Yamazaki et al. |
| 2002/0146893 A1 | 10/2002 | Shimoda et al. |
| 2003/0025118 A1 | 2/2003 | Yamazaki et al. |
| 2003/0032210 A1 | 2/2003 | Takayama et al. |
| 2003/0047280 A1 | 3/2003 | Takayama et al. |
| 2003/0047732 A1 | 3/2003 | Yamazaki et al. |
| 2003/0064569 A1 | 4/2003 | Takayama et al. |
| 2003/0082889 A1 | 5/2003 | Maruyama et al. |
| 2003/0217805 A1 | 11/2003 | Takayama et al. |
| 2003/0231263 A1 | 12/2003 | Kato et al. |
| 2004/0087110 A1 | 5/2004 | Takayama et al. |
| 2004/0121516 A1 | 6/2004 | Yamazaki et al. |
| 2004/0124542 A1 | 7/2004 | Kuwabara et al. |
| 2004/0140547 A1 | 7/2004 | Yamazaki et al. |
| 2004/0212012 A1 | 10/2004 | Yamazaki et al. |
| 2004/0232413 A1 | 11/2004 | Yamazaki et al. |
| 2004/0238827 A1 | 12/2004 | Takayama et al. |
| 2005/0001211 A1 | 1/2005 | Yamazaki et al. |

FOREIGN PATENT DOCUMENTS

| | | |
|---|---|---|
| JP | 06-244360 | 9/1994 |
| JP | 08-186156 | 7/1996 |
| JP | 10-125929 | 5/1998 |
| JP | 10-125930 | 5/1998 |
| JP | 10-125931 | 5/1998 |
| JP | 2000-061785 | 2/2000 |
| JP | 2000-294723 | 10/2000 |
| JP | 2002-049359 | 2/2002 |
| JP | 2002-189447 | 7/2002 |
| JP | 3408154 | 5/2003 |

OTHER PUBLICATIONS

"Mass Production of Organic EL Devices"; *Shimotsuke Newspaper*; Jul. 3, 2003 (full translation).

"Two-way display developed"; Newspaper "*The Japan Times*"; Jul. 3, 2003.

*Exhibition of Active Matrix Type Organic EL Display at "13$^{th}$ Flat Panel Display Manufacturing Technology Expo & Conference*" by ELDis Group; Jul. 2, 2003 (full translation).

Documents distributed in the "*13$^{th}$ Flat Panel Display Manufacturing Technology Expo & Conference*" by ELDis Group; Jul. 2, 2003 (full translation).

\* cited by examiner

SEMICONDUCTOR CHIP AND METHOD FOR MANUFACTURING THE SAME

BACKGROUND OF THE INVENTION

1. Field of the Invention

The present invention relates to a semiconductor chip and a manufacturing method for the semiconductor chip manufactured by stacking a plurality of device formative layers which includes a semiconductor apparatus, a display apparatus, and a light-emitting apparatus each of which is composed of a plurality of thin film transistors (hereinafter, TFTs) over a substrate. The above described semiconductor apparatus includes a CPU, (Central Processing Unit), an MPU (Micro Processor Unit), a memory, a microcomputer, and an image processor. The above described display apparatus includes a liquid crystal display apparatus, PDP (Plasma Display Panel), FED (Field Emission Display), or the like. The above described light-emitting apparatus includes an electroluminescent apparatus or the like.

2. Related Art

In recent years, a technique for fabricating a TFT using a semiconductor thin film (having a thickness of from approximately several to several hundreds nm) fabricated over a substrate having an insulating surface has been attracted attention. A TFT is widely utilized for an electronic device such as an IC, an optical device, or the like.

However, there has been a problem that a requirement for a substrate that is used while forming a TFT and a requirement for a substrate that is used after forming a TFT are not same.

For instance, as a substrate for forming a TFT, a glass substrate or a quartz substrate is widely used now since these substrates have high heat-resistance so that they can be used when the process temperature is high, however, these substrates have some disadvantages such as being fragile and heavy.

On the other hand, a flexible substrate such as a plastic film, although it cannot be used in the process at a high temperature for its low heat-resistance, has advantages such as hardly being cracked and being lightweight. However, a TFT formed in the process at a low temperature cannot obtain greater electric characteristics than that formed over a glass substrate or a quartz substrate.

As a technique that utilizes merits of using these both substrates, a technique for fabricating a thin film device over a glass substrate or a quartz substrate, and separating the thin film device (separated body) from the substrate, and then transferring to a transferred body such as a plastic substrate, etc are disclosed. (For example, Japanese Laid-Open Patent Application No. 10-125929.)

According to this, a thin film device can be formed over various substrates no matter what process the thin film device went through by using the technique for separating and transferring the thin film device to another substrate.

In the field of LSI, various ways for manufacturing a high-integrated semiconductor apparatus has been proposed, for example, a technique for packaging a semiconductor device in three dimensions by stacking a plurality of chips is known. (For example, Japanese Laid-Open Patent Application No. 6-244360)

However, a stacked semiconductor chip is expected to be formed into a further thinner film in realizing its high performance, its high operation, and its miniaturization since there is a technical limit in forming the semiconductor chip into a thin film.

SUMMARY OF THE INVENTION

In view of the foregoing, it is an object of the present invention to provide a semiconductor apparatus in which a plurality of device formative layers formed into a thin film over a substrate (including a semiconductor apparatus (a CPU, an MPU, a memory, a microcomputer, an image processor, or the like), a display apparatus (a liquid crystal display apparatus, a PDP, a FED, or the like), or a light-emitting apparatus) are integrated.

A further object of the present invention is to form a structure that prevents each device from deteriorating due to accumulated heat generated in each device formative layer in case of integrating a plurality of device formative layers over a substrate.

According to the present invention, a semiconductor chip that is higher integrated and that is formed into a thinner film compared with the conventional semiconductor chip packaged in three dimensions can be realized by transferring a device formative layer with a thickness of at most 50 µm which is separated from a substrate to another substrate by using a technique for transferring, and transferring another device formative layer with a thickness at most 50 µm which is separated from another substrate to the above device formative layer, and repeating such transferring process.

In the present invention, a substrate is characterized by being formed of a thermal conductive material that can radiate heat effectively in consideration of the fact that a device formative layer serving as a transferred body has a thickness of at most 50 µm and a device is easily deteriorated due to heat generated in the device formative layer. In addition, a thermal conductive thin film is preferably fabricated over the surface of a transferred body (over the transferred device formative layer) in case of transferring another device formative layer to the transferred device formative layer.

As used herein, the term "thermal conductive substrate" refers to a substrate formed of a ceramic material containing aluminum oxide (alumina), aluminum nitride, aluminum nitride oxide, silicon nitride, or the like as its main components, and a graphite material containing carbon as its main components. As used herein, the term "thermal conductive thin film" refers to a thin film of aluminum nitride (AlN), aluminum nitride oxide ($AlN_xO_y$(X>Y)), boron phosphide (BP), or diamond like carbon (DLC: Diamond Like Carbon), or a lamination film or the like of these films.

The lamination structure according to the present invention, with respect to the electric interconnection in a lateral direction, is characterized by the flip chip structure in which wirings (auxiliary wirings) are formed into each device formative layer in advance, and the wirings are connected electrically to the wirings in the other device formative layer when these device formative layers are stacked and bonded each other in a lateral direction, in addition to a wire bonding structure in which terminals provided in a part of each layer are connected each other by connection wires.

A method for separating or transferring used in the present invention is not especially limited. For example as the method for separating or transferring, a metal layer (or a metal nitride layer) is fabricated over a substrate, a metal oxide layer is fabricated thereon, and an oxide layer is fabricated in contact with the metal oxide layer, and then, a device is formed over the oxide layer, subsequently, the device is separated from the substrate by splitting-off the metal oxide layer or an interface between the metal oxide layer and another layer. In addition, in order to improving the way of separating, a heat treatment or a laser light irradiation may be carried out. Or it is possible that a film containing hydrogen is fabricated over the oxide layer and a heat treatment is carried out on the resulted film to crystallize metal oxides. Further, a stress peel-off method may be adopted by which a film is separated utilizing membrane stress between two layers.

In addition, a method for separating by which a device formative layer and a substrate are separated by means of fabricating a layer for separating between the device formative layer and the substrate and removing the resulted layer by etchant can be adopted. Further, a method for separating by which a device formative layer and a substrate are separated by means of fabricating an amorphous silicon layer (or a polysilicon layer) between the device formative layer and the substrate and by irradiating laser light to the resulted amorphous silicon layer through the substrate can also be adopted.

The constitution according to the present invention is a semiconductor chip having a structure in which a plurality of device formative layers having thicknesses of at most 50 μm is fabricated over a substrate having thermal conductivity.

A semiconductor chip having a plurality of devices formative layers with thicknesses of at most 50 μm over a thermal conductive substrate, comprising:

a first device formative layer with a thickness of at most 50 μm fabricated over the thermal conductive substrate via a first adhesive layer;

a thermal conductive film fabricated in contact with the first device formative layer; and a second device formative layer with a thickness of at most 50 μm fabricated over the thermal conductive film via a second adhesive layer.

The device formative layer (the first device formative layer and the second device formative layer) in the above constitution is preferably has a thickness of from 0.1 to 10 μm.

In the above constitution, a semiconductor device included in the first device formative layer and a semiconductor device included in the second device formative layer are electrically connected each other via connection wires by wirings included in the first device formative layer and wirings included in the second device formative layer.

In another constitution, a semiconductor device included in the first device formative layer and a semiconductor device included in the second device formative layer are electrically connected each other via the first and second adhesive layers containing an anisotropic conductive material by connection wires connected to each wirings included in the first device formative layer and wirings included in the second formative layer.

As an anisotropic conductive material, metallic particles such as Ag, Au, Al, or the like coated with insulating films and having a unidirectional conductivity can be used. In case of using anisotropic conductive materials for bonding the first and second device formative layers, it is preferably to irradiate the device formative layers with ultra waves to strengthen their adhesiveness.

In the present invention, the device formative layer is not limited to have one layer. The number of the device formative layer can be increased by stacking sequentially a film having thermal conductivity and a device formative layer as in the case with the second device formative layer.

The device formative layer includes TFTs, a semiconductor apparatus formed by combining these TFTs (a CPU, an MPU, a memory, a microcomputer, an image processor, or the like), a display apparatus (a liquid crystal display apparatus, a PDP, a FED, or the like), or a light-emitting apparatus.

The constitution of the present invention is a method for manufacturing a semiconductor chip having a plurality of device formative layers with thicknesses of at most 50 μm over a thermal conductive substrate for obtaining a semiconductor chip that is integrated without increasing the area by stacking sequentially device formative layers with thicknesses of at most 50 μm over a thermal conductive substrate, comprising the steps of:

fabricating a first device formative layer including a plurality of thin film transistors over a first substrate;

fabricating a soluble organic resin film over the first device formative layer;

fabricating a first adhesive layer in contact with the first soluble organic resin film;

bonding the second substrate to the first soluble organic resin film via the first adhesive layer, and sandwiching the first device formative layer and the first soluble organic resin film between the first substrate and the second substrate;

separating and removing the first substrate from the first device formative layer by a physical means;

fabricating a second adhesive layer in contact with the thermal conductive substrate;

bonding an exposed surface of the first device formative layer to the thermal conductive substrate via the second adhesive layer;

separating the first adhesive layer and the second substrate from the first device formative layer;

removing the first soluble organic resin film with solvent;

fabricating a thin film having thermal conductivity over an exposed surface;

fabricating a second device formative layer including a plurality of thin film transistors over a third substrate;

fabricating a second soluble organic resin film over the second device formative layer;

fabricating a third adhesive layer in contact with the second soluble organic resin film;

bonding the fourth substrate to the second soluble organic resin film via the third adhesive layer, and sandwiching the second device formative layer and the second soluble organic resin film between the third substrate and the fourth substrate;

separating and removing the third substrate from the second device formative layer by a physical means;

fabricating a fourth adhesive layer in contact with a thin film having thermal conductivity; and an exposed surface of the second device formative layer over the thin film having thermal conductivity via the fourth adhesive layer.

In the above constitution, the thin film having thermal conductivity is formed of a film of aluminum nitride, aluminum nitride oxide, boron phosphide, boron nitride, or diamond like carbon, or a lamination film of these films, each of which is formed by sputtering.

Further, in the above constitution, either or both of the second adhesive layer and the fourth adhesive layer are fabricated by using an anisotropic adhesive, and the device formative layer is bonded via either or both of the second adhesive layer and the fourth adhesive layer by being irradiated with ultra waves.

In the above each constitution, the constitution in which a metal layer, a metal oxide layer, and an oxide layer are fabricated sequentially over a first substrate and a third substrate to form a metal oxide having a crystal structure within the metal oxide layer for separating and removing the first easily substrate and the third substrate by a physical means of splitting-off the metal oxide layer is included. Further, the constitution in which the metal oxide layer having a crystal structure is fabricated by fabricating a film containing hydrogen (a silicon nitride film, a silicon nitride oxide film, an amorphous semiconductor film, or the like) over the oxide layer and heat-treating the resulted film for dispersing hydrogen is included in the above each constitution.

For separating easily the first substrate or the third substrate, reinforcing substrates can be bonded to each the first substrate or the third substrate via adhesive layers. The reinforcing substrate can be separated together with the first substrate or the third substrate.

According to the present invention, a semiconductor chip can be formed into a thinner film and a higher integrated semiconductor chip by stacking a plurality of device formative layers with thicknesses of at most 50 μm over a thermal conductive film by a technique for transferring compared with the case of packaging the device formative layers in three dimension. The problems arisen in case of stacking a plurality of thin device formative layers that the heat accumulation and the deterioration of a device due to the accumulated heat can be prevented by interposing thermal conductive layers between the laminated device formative layers.

DESCRIPTION OF THE PREFFERED EMBODIMENTS

Hereafter, embodiment modes of the present invention will be described.

Embodiment Mode 1

Figure 1A:
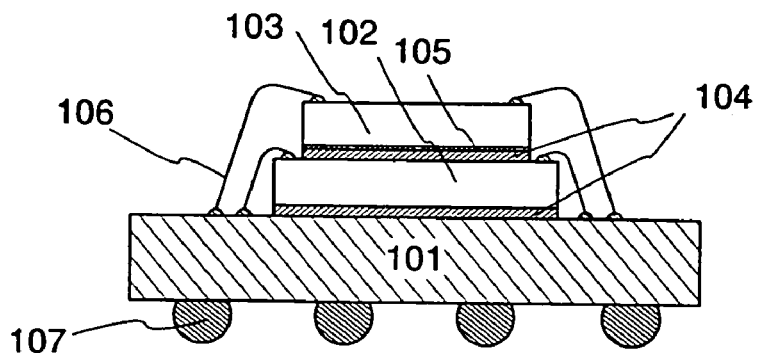
FIGS. 1A to 1C are explanatory views of the structure of a semiconductor chip according to the present invention.

The structure of a semiconductor chip manufactured according to the present invention is explained with reference to FIGS. 1A to 1C. As shown in FIG. 1A, the semiconductor chip according to the present invention has a wire bonding structure in which a first device formative layer 102 is stacked over thermal conductive substrate 101 interposing an adhesive layer 104, and a second device formative layer 103 is stacked thereon interposing an adhesive layer 104, then, wirings (not shown) of each the first device formative layer 102 and the second device formative layer 103 are connected electrically to wirings (not shown) of the thermal conductive substrate 101 by connection wires 106.

The device formative layers (the first device formative layer 102 and the second device formative layer 103) have thicknesses at most 50 μm. Further, these device formative layers were fabricated in advance over another substrate and separated from the substrate by a technique for separating.

A substrate having thermal conductivity (the thermal conductive substrate 101) is used for the substrate on which the first device formative layer 102 is pasted since the device formative layer according to the present invention is a thin film having a thickness of at most 50 μm and a device is susceptible to generated heat. In case of fabricating the second device formative layer 103 over the first device formative layer 102 via the adhesive layer 104, a thermal conductive film 105 is fabricated in contact with the first device formative layer 102. In addition, a flattening film may be fabricated over the surface of the thermal conductive substrate 101 for preventing device destruction or interconnection destruction in the first device formative layer 102 or the second device formative layer 103, which are thin films, due to irregularities (not shown) of the surface of the thermal conductive substrate 101.

As the thermal conductive substrate 101, a ceramic substrate containing aluminum oxide (alumina), aluminum nitride (AlN), aluminum nitride oxide ($AlN_xO_y$(X>Y)), silicon nitride, or the like as its main components, and a graphite substrate containing carbon as its main components can be used. As the thermal conductive film 105, a film of aluminum nitride (AlN), aluminum nitride oxide ($AlN_xO_y$ (X>Y)), boron phosphide (BP), boron nitride (BN), diamond like carbon (DLC: Diamond Like Carbon), or a lamination film or the like of these films can be used.

A method for fabricating the thermal conductive film 105, sputtering, vapor deposition, CVD, or the like can be used.

For example, in case of fabricating the thermal conductive film 105 by AlN, the film is deposited by using aluminum nitride (AlN) target under the atmosphere composed of mixed gas of argon gas and nitride gas. In addition, the film can be deposited using aluminum (Al) target under the atmosphere of nitride gas.

Each the pasted first device formative layer 102 and second device formative layer 103 is electrically connected to the wirings (not shown) over the thermal conductive substrate by the connection wire 106 respectively. As a material for forming the connection wire, a wire formed of Au, Cu, Al, Al—Si, or an alloy of Au can be used.

The first device formative layer 102 and the second device formative 103 can be electrically connected to the outside by bonding the wirings of the thermal conductive substrate to a printed wiring board (not shown) via a solder ball 107 connected electrically to the wirings of the thermal conductive substrate 101.

The structure of the device formative layer (the first device formative layer 102 and the second device formative 103) shown in FIG. 1A and electrical interconnection between the device formative layer and the thermal conductive substrate 101 by the connection wire 106 are explained with reference to FIG. 1B.

In the device formative layer 102, a plurality of thin film transistors (hereinafter, TFTs) are formed as semiconductor devices, and a semiconductor apparatus (a CPU, an MPU, a memory, a microcomputer, an image processor, or the like); a display apparatus (a liquid crystal apparatus, a PDP, an FED, or the like); or a light-emitting apparatus, each of which includes devices formed by combining these TFTs, is manufactured.

The first device formative layer 102 includes an oxide layer 108a a part of which has a metal oxide layer since the device formative layer can be obtained as the following process: a plurality of TFTs and wirings (auxiliary wiring) are formed over a metal layer, a metal oxide layer, and an oxide layer fabricated over a substrate, and the oxide layer and TFTs formed over the oxide layer are separated from the substrate and the metal layer by splitting-off the metal oxide layer by a physical means. The oxide layer 108a a part of which has a metal oxide layer is bonded to the thermal conductive substrate 101 via an adhesive layer 104a.

As a material for forming the adhesive layer 104a, various curing adhesives such as a photo-curing adhesive, for example, a reaction-curing adhesive, a thermal-curing adhesive, or a UV-curing adhesive, or an anaerobic adhesive can be used.

The device formative layer 103 is fabricated over the first device formative layer 102 via the thermal conductive film 105.

The second device formative layer 103 includes an oxide layer 108b a part of which has a metal oxide layer since the device formative layer can be obtained as the following process: a plurality of TFTs and wirings (auxiliary wiring) are formed over a metal layer, a metal oxide layer, and an oxide layer fabricated over a substrate, and the oxide layer and TFTs formed over the oxide layer are separated from the substrate and the metal layer by splitting-off the metal oxide layer by a physical means. The oxide layer 108b a part of which has a metal oxide layer is bonded to the thermal conductive film 105 via an adhesive layer 104b.

As a material for forming the adhesive layer 104b, various curing adhesives such as a photo-curing adhesive, for example, a reaction-curing adhesive, a thermal-curing adhesive, or a UV-curing adhesive, or an anaerobic adhesive can be used.

The first device formative layer 102 and the second device formative layer 103 can electrically connect to the outside by wirings (110a, 110b) formed in each the first device formative layer 102 and the second device formative layer 103 via an electrode pad 111.

A semiconductor apparatus, a display apparatus, a light-emitting apparatus, or the like, each of which includes devices composed of a plurality of TFTs and is formed in the first device formative layer 102 and the second device formative layer 103, is electrically connected to the wirings formed over the thermal conductive substrate by the connection wire 106.

Although the case that the device formative layer is formed to have a two-lamination layer is explained in Embodiment Mode 1, but not exclusively, the device formative layer may be formed to have a three- or more-lamination layer.

Thus, a semiconductor chip having a structure in which a plurality of device formative layers are stacked over the thermal conductive substrate.

Figure 1B:
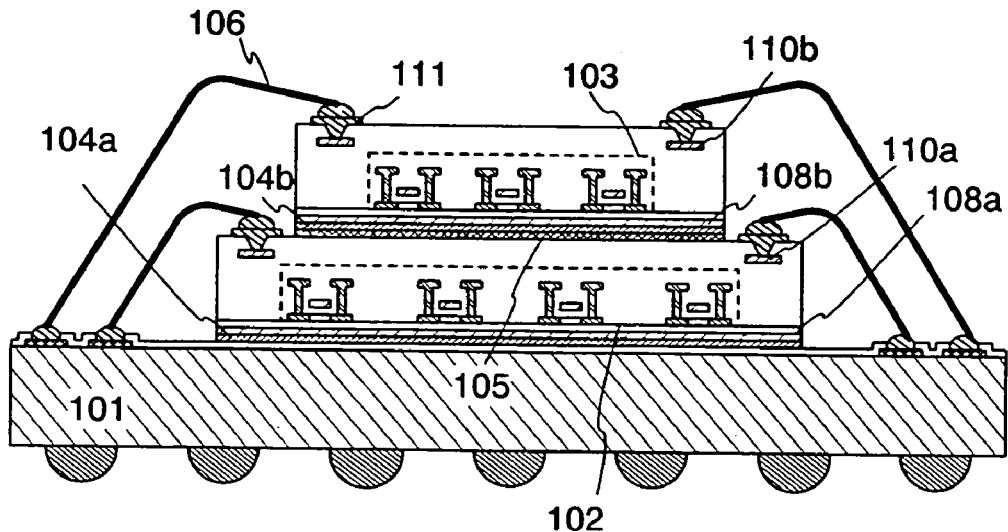
Figure 1C:
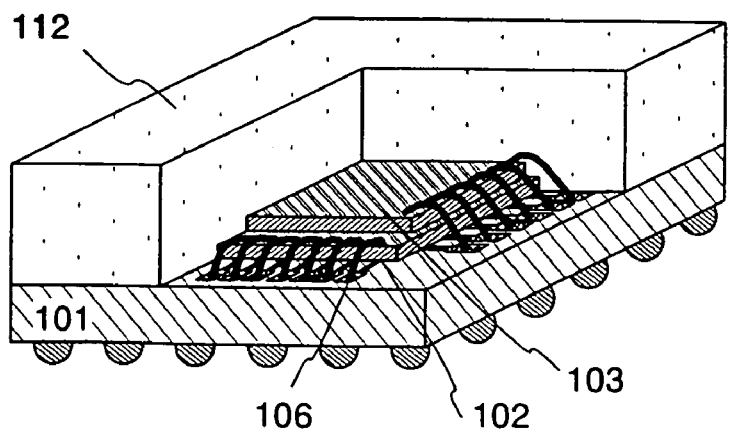

After forming the interconnection structure shown in FIG. 1B, a resin 112 may be formed to encapsulate the device formative layer (102, 103) and the connection wire 106. In addition, a material for the resin 112, a thermosetting resin or a thermoplastic resin can be used. Specifically, a mold resin such as an epoxy resin, a silicon resin, a PPS resin (polyphenylene sulfide resin), or the like can be used. In the present invention, a substrate formed of glass, quartz, plastic, or a metal material can be used instead of resin.

Embodiment Mode 2

The structure of a semiconductor chip that is different from that described in Embodiment Mode 1 will be described in Embodiment Mode 2. FIGS. 1A to 1C illustrate the structure that the device formative layer is electrically connected to the thermal conductive substrate by the connection wire 106. In this embodiment, the case of adopting a flip chip structure in which laminated device formative layers are connected electrically to a thermal conductive layer without using connection wires will be described.

Figure 2A:
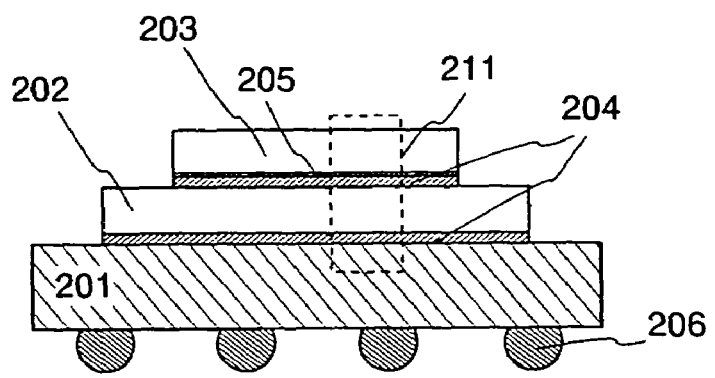
FIGS. 2A to 2C are explanatory views of the structure of a semiconductor chip according to the present invention.

As shown in FIG. 2A, a first device formative layer 202 having a thickness at most 50 μm is stacked over a thermal conductive substrate 201 via an anisotropic conductive layer 204, and a second device formative layer 203 having a thickness at most 50 μm is stacked over the first conductive layer 202 via an anisotropic conductive layer 203. Here, wirings are exposed over the surface of each the first device formative layer 202 and the second device formative layer 203, these wirings are electrically connected each other via the anisotropic conductive layer 204, and also electrically connected to the wirings (not shown) over the thermal conductive substrate.

The first device formative layer 202 and the second device formative 203 can be electrically connected to the outside by bonding the wirings of the thermal conductive substrate 201 to a printed wiring board (not shown) via a solder ball 206 connected electrically to the wirings of the thermal conductive substrate 201.

Here, the structure of the device formative layer (the first device formative layer 202 and the second device formative 203) shown in FIG. 2A and electrical interconnection between the device formative layer and the thermal conductive substrate 201 by auxiliary wirings a and b (210a and 210b) are explained with reference to FIG. 2B.

In the first device formative layer 202, a plurality of thin film transistors (hereinafter, TFTs) is formed as a semiconductor device, and a semiconductor apparatus composed of the TFTs (a CPU, an MPU, a memory, a microcomputer, an image processor, or the like); a display apparatus (a liquid crystal apparatus, a PDP, an FED, or the like); or a light-emitting apparatus, each of which includes these devices formed by combining these TFTS, is manufactured.

The separated surface of first device formative layer 202 includes an exposed oxide layer 208a and a part of an auxiliary wiring a (210a) since the first device formative layer 202 can be obtained as the following process: a plurality of TFTs and wirings (auxiliary wiring) are formed over a metal layer, a metal oxide layer, and an oxide layer fabricated over a substrate, and the oxide layer and TFTs formed over the oxide layer are separated from the substrate and the metal layer by splitting-off the metal oxide layer by a physical means, then, the auxiliary wiring a (210a) for reaching a wiring 209a is formed over the separated surface. The oxide layer 208a and the auxiliary wiring a (210a) are bonded to the thermal conductive substrate 201 via the anisotropic adhesive layer 204a. Thus, the auxiliary wiring a (210a) formed over the first device formative layer 202 is connected electrically to the wiring (not shown) over the thermal conductive substrate 201 via the anisotropic conductive adhesive layer 204a.

As a material for fabricating the anisotropic conductive adhesive layer 204a, an anisotropic conductive adhesive, which is made by dispersing an anisotropic conductive material on a photo-curing adhesive such as a reaction-curing adhesive, a thermal-curing adhesive, or a UV-curing adhesive, or an anaerobic adhesive, can be used. As an anisotropic conductive material, metal particles such as Ag, Au, Al, or the like coated with insulating films and having a unidirectional conductivity can be used. In case of using an anisotropic conductive, it is preferably to bond the first device formative layer with irradiating ultrasonic waves for obtaining the strong adhesiveness.

The second device formative layer 203 is stacked over the first device formative layer 202 via the thermal conductive film 205.

The separated surface of second device formative layer 203 includes an exposed oxide layer 208b and a part of an auxiliary wiring a (210b) since the device formative layer can be obtained as the following process: a plurality of TFTs and wirings (auxiliary wiring) are formed over a metal layer, a metal oxide layer, and an oxide layer fabricated over a substrate, and the oxide layer and TFTs formed over the oxide layer are separated from the substrate and the metal layer by splitting-off the metal oxide layer by a physical means, then, the auxiliary wiring a (210b) for reaching a wiring 209 is formed over the separated surface. The oxide layer 208b and the auxiliary wiring a (210b) are connected to the first device formative layer 202 via the anisotropic adhesive layer 204b. Thus, the auxiliary wiring a (210b) and the wiring 209b formed over the first device formative layer 202 are electrically connected via the anisotropic conductive adhesive layer 204b, moreover, connected electrically to wirings (not shown) formed over the thermal conductive substrate 201.

As a material for fabricating the anisotropic conductive adhesive layer 204b, an anisotropic conductive adhesive, which is made by dispersing an anisotropic conductive material on a photo-curing adhesive such as a reaction-curing adhesive, a thermal-curing adhesive, or a UV-curing adhesive, or an anaerobic adhesive, can be used. As an anisotropic conductive material, a metal particle such as Ag, Au, Al, or the like coated with an insulating film and having a unidirectional conductivity can be used. In case of using an anisotropic conductive, it is preferably to bond the second device formative layer with irradiating ultrasonic waves for obtaining the strong adhesiveness.

Figure 2B:
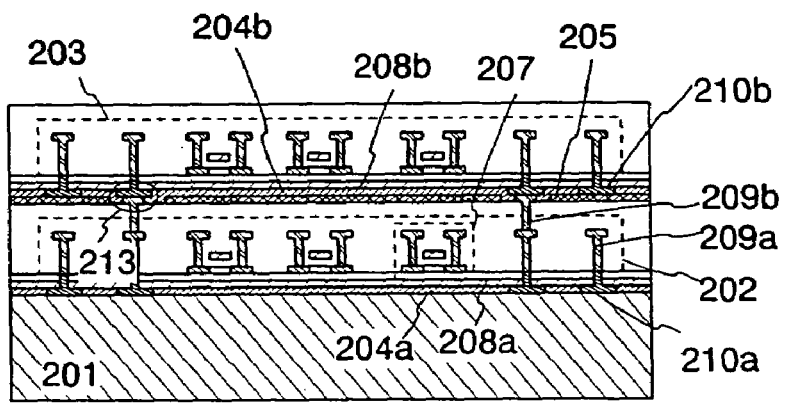
Figure 2C:
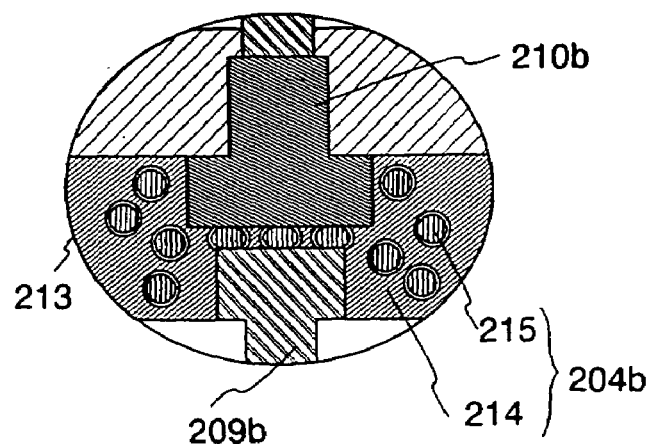

FIG. 2C is an enlarged view showing reference numeral 213 in FIG. 2B. Thus, the auxiliary wiring b (210b) formed in the second formative layer 202 and the wiring 209b formed in the first device formative layer 202 are electrically connected each other via an anisotropic conductive particle 215 within the anisotropic conductive adhesive layer 204b composed of the anisotropic conductive particle 215 and an adhesive 214. Here, the anisotropic conductive particle 215 has the structure in which metallic particles are coated with insulating films.

Therefore a semiconductor apparatus, a display apparatus, a light-emitting apparatus, or the like, each of which includes a device composed of a plurality of TFTs and is formed in the first device formative layer 202 and the second device formative layer 203, is electrically connected to the wirings formed over the thermal conductive substrate by the auxiliary wirings a and b (210a and 210b) and the anisotropic conductive adhesive layers (204a, 204b).

The case that the device formative layer is formed to have a two-lamination layer is explained in Embodiment Mode 2, but not exclusively, the device formative layer may be formed to have a three- or more-lamination layer.

Thus, a semiconductor chip having a structure in which a plurality of device formative layers are stacked over the thermal conductive substrate.

Figure 16A:
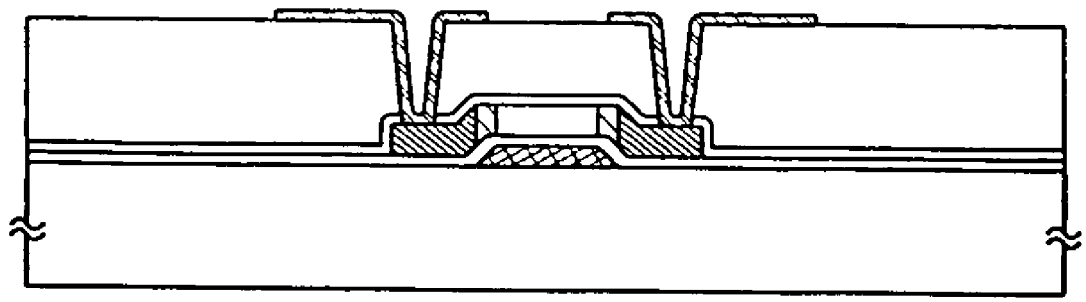
FIGS. 16A and 16B are explanatory views of a bottom gate TFT and a dual gate TFT.
Figure 16B:
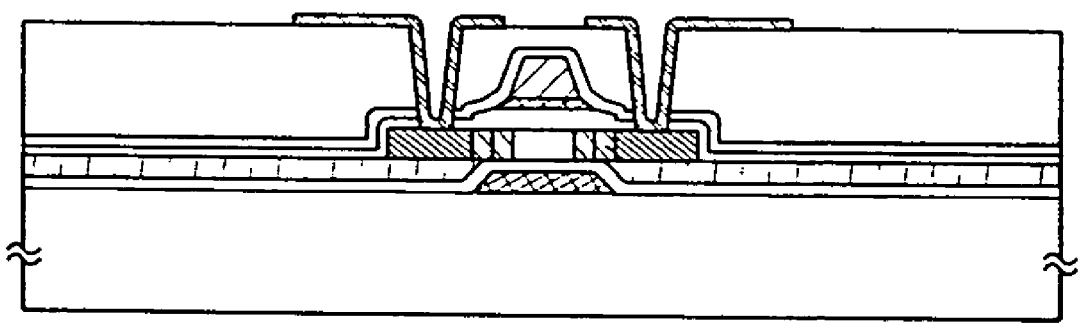

A top gate TFT is explained as an example of the type of a TFT in Embodiment Mode 1 and Embodiment Mode 2 in the present invention, but not exclusively, a bottom gate TFT having a structure in which a gate electrode is formed on the underside of an active layer as shown in FIG. 16A, or a dual gate TFT having a structure in which two gate electrodes are formed so as to sandwich an active layer as shown in FIG. 16B can be also adopted.

Embodiments

Hereinafter, Embodiments of the present invention will be described.

Embodiment 1

In this embodiment, a method for manufacturing a semiconductor chip according to the present invention, which has a structure explained in Embodiment Mode 1, will be described with reference to FIGS. 3A to 5C.

Figure 3A:
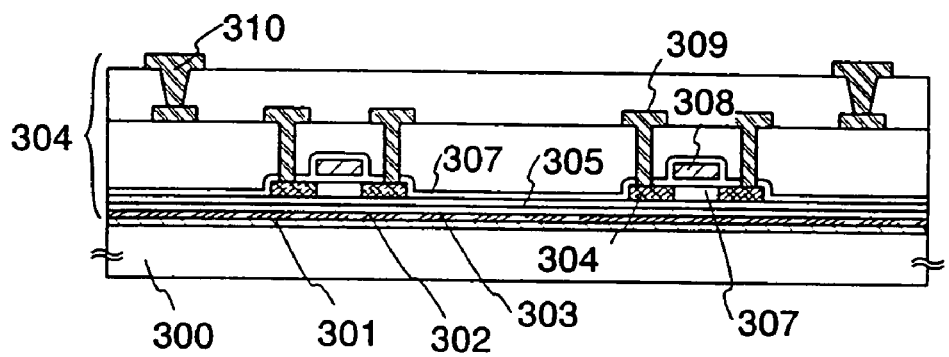
FIGS. 3A to 3C are explanatory views of a method for manufacturing a semiconductor chip according to the present invention.
Figure 3B:
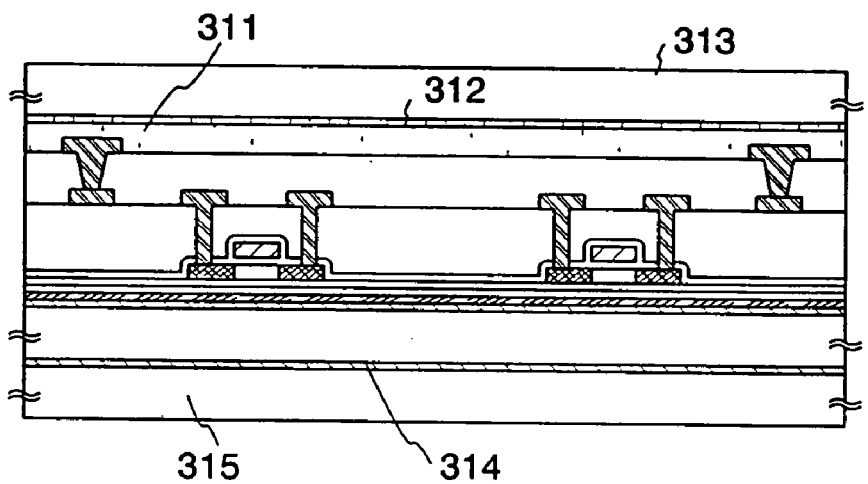

FIG. 3A is a view of showing a state that a metal layer 301, a metal oxide layer 302, and an oxide layer 303 are sequentially fabricated over a first substrate 301, and a device formative layer 250 is fabricated thereon.

As the first substrate 300, a glass substrate, a quartz substrate, a ceramic substrate, a silicon substrate, a metal substrate, or a stainless substrate, or the like, can be used. In this embodiment, AN 100 which is a glass substrate, is utilized.

As materials for the metal layer 301 fabricated over the first substrate 300, an element selected from the group consisting of W, Ti, Ta, Mo, Nd, Ni, Co, Zr, Zn, Ru, Rh, Pd, Os, Ir, and Pt; a single layer fabricated of an alloy material or a compound material containing these elements as its main components; a lamination layer of the single layers; or nitrides, for example, a single layer or a lamination layer fabricated of titanium nitride, tungsten nitride, tantalum nitride, or molybdenum nitride. The metal layer 301 is fabricated to have a thickness of from 10 to 200 nm, preferably, from 50 to 75 nm.

In case of forming a metal layer 301 by sputtering, the thickness at the vicinity of its periphery portion of the first substrate 300 is tend to be inhomogeneous since the first substrate 300 is fixed. Therefore, it is preferable that only the periphery portion is removed by dry etching. In this regard, an insulating film fabricated of an oxynitride silicon film may be fabricated to have a thickness of approximately 100 nm between the first substrate 300 and the metal layer 301 to prevent the first substrate 300 from being etched.

The metal oxide layer 302 and the oxide layer 303 are fabricated over the metal layer 301. In this embodiment, the case that the oxide layer 303 is fabricated, and the metal layer 301 is oxidized in the following process, and then, these layers are formed into the metal oxide layer 302 will be described.

Therefore a layer fabricated of tungsten is fabricated to have a thickness of from 10 to 200 nm, preferably, from 50 to 75 nm as the metal layer 301. Further, the oxide layer 303, here a silicon oxide layer, is stacked thereon to have a thickness of from 150 to 200 nm without exposing to the atmosphere. The thickness of the oxide layer 303 is preferably more than twice as large as that of the metal layer 301. For example, a silicon oxide film is preferably fabricated to have a thickness of from 150 to 200 nm by sputtering using silicon oxide targets.

A device formative layer 250 fabricated over the oxide layer 303 is the layer in which a semiconductor apparatus, a display apparatus, or a light-emitting apparatus including a device formed by combining appropriately TFTs (p-channel TFTs or n-channel TFTs) is formed. The TFT described here is composed of an impurity region 304, a channel formation region 306, each of which is formed in a part of a semiconductor film over a base film 305a, a gate insulating film 307, and a gate electrode 308, and is connected electrically by a wiring 309. Further, an electrode pad 310 which makes it possible to connect to the outside is formed.

In the process for fabricating the device formative layer 250, heat treatment is carried out after forming a material film containing hydrogen at least (a semiconductor film or a metal film) to diffuse the hydrogen contained in the material film. The heat treatment may be carried out at least 420° C. The heat treatment may be carried out separately from the process for fabricating the device formative layer 250, or carried out simultaneously for simplification of processes. For example, in case of fabricating an amorphous silicon film containing hydrogen as a material film containing hydrogen by sputtering and heating the amorphous silicon film to form a polysilicon film, hydrogen in the amorphous silicon film can be diffused by the heat treatment at least 500° C. simultaneously with forming a polysilicon film by the heat treatment.

According to the heat treatment, the metal oxide layer 302 having a crystal structure is fabricated between the metal layer 301 and the oxide layer 303. An amorphous metal oxide layer (tungsten oxide layer) with a thickness of from 2 to 5 nm fabricated between the metal layer 301 and the oxide layer 303 by stacking the metal layer 301 and the oxide layer 303 is included in the metal oxide layer 302 since the metal oxide layer (tungsten oxide layer) is formed to have a crystal structure by this heat treatment.

In this embodiment, the case that the metal oxide layer 302 is fabricated in the process for manufacturing a part of a device formative layer is explained, but not exclusively, the metal oxide layer 302 may be formed after forming the oxide layer 301, and the oxide layer 303 may be formed thereafter.

Next, an organic resin layer 311 is fabricated over the device formative layer 250. As a material for fabricating the organic resin layer 311, an organic material that is soluble in water or alcohol is used. The organic resin layer 311 is fabricated by coating the organic material over the whole surface and curing. The organic material may be composed of, for example, epoxy series, acrylate series, silicon series, or the like. Specifically, water-soluble resin (TOAGOSEI Co., Ltd.: VL-WSHL10) is spin-coated to have a thickness of 30 μm, and exposed for two minutes to be partially cured, then, exposed its back with UV rays for 2.5 minutes, and then, exposed its surface for 10 minutes to be fully cured. Consequently, the organic resin layer 311 is fabricated.

The adhesiveness of the metal oxide layer 302 is partly weakened in order to make it easier for layers to be separated. The partly wakening process of adhesiveness is carried out by irradiating laser light on the region that is to be peeled-off of the metal layer 301 or the oxide layer 303 along with the periphery thereof, or pressuring locally from outside on the region that is to be separated along with the periphery thereof for damaging a part of the inside or the boundary face of the oxide layer 303. Specifically, a hard needle such as a diamond pen may be attached perpendicular to the region to be separated and moved along with the periphery thereof with applying loading. Preferably, a scriber device can be used to move with applying loading on the region with press force ranging from 0.1 to 2 mm. It is important to carry out some processes for easy separating, that is, to prepare for separating process. Such preparatory process for weakening selectively (partly) the adhesiveness will prevent poor separating and improve the process yield.

By fabricating a first adhesive layer 312, a second substrate 313 can be bonded to the organic resin layer 311 via the first adhesive layer 312. As a material for fabricating the first adhesive layer 312, a known material that its adhesive can weaken by carrying out a predefined treatment in the following process can be used, however, the case that a photosensitive two-side tape that its adhesiveness weaken due to light irradiation is used in the following process will be described in this embodiment.

The second adhesive layer 314 is also fabricated over the exposed surface of the first substrate 300. The third substrate 315 is bonded thereto via the second adhesive layer 314. As a material for fabricating the second adhesive layer 314, a two-side tape is used same as the first adhesive layer 312. The third substrate 315 prevents the first substrate 300 from damaging in the following separating process. For the second substrate 313 and the third substrate 315, the substrate that has higher rigidity than that of the first substrate 300, for example, a quartz substrate or a semiconductor substrate, is preferably to be used.

Figure 3C:
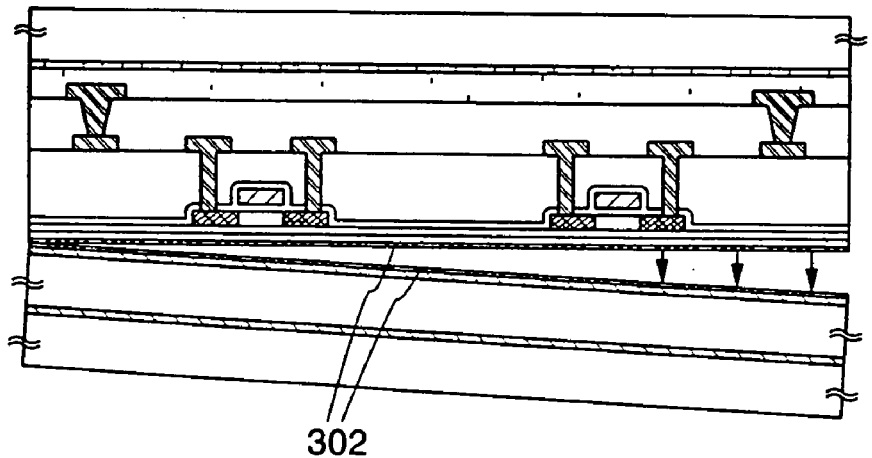

The first substrate 300 provided with the metal film 301 is separated from the side of the region, which is partly weakened its adhesiveness, by a physical means. The metal layer 301 and the substrate 300 can be separated by splitting-off the metal oxide layer 302 with comparatively small force (for example, man's hand, air pressure of gas sprayed from a nozzle, ultrasonic waves, or the like). Specifically, the first substrate 300 can be separated by splitting-off a tungsten oxide layer, an interface between a tungsten oxide layer and a silicon oxide layer, or an interface between a tungsten oxide layer and a tungsten film. Thus, the device formative layer 250 formed over the oxide layer 303 can be separated from the first substrate 300. FIG. 3C shows a state of after separating process.

A portion of the metal oxide layer 302 is remained over the surface exposed by separating. The remained metal oxide layer 302 may hinder the bond between the exposed surface and the substrate or the like, so that the remained metal oxide layer 302 is preferably removed. For removing the remained metal oxide layer 302, aqueous alkali such as aqueous ammonia or aqueous acids can be used. In addition, the following process may be carried out at the temperature (at most 430° C.) which makes it easier for the portion of the metal oxide layer 302 to be separated.

Figure 4A:
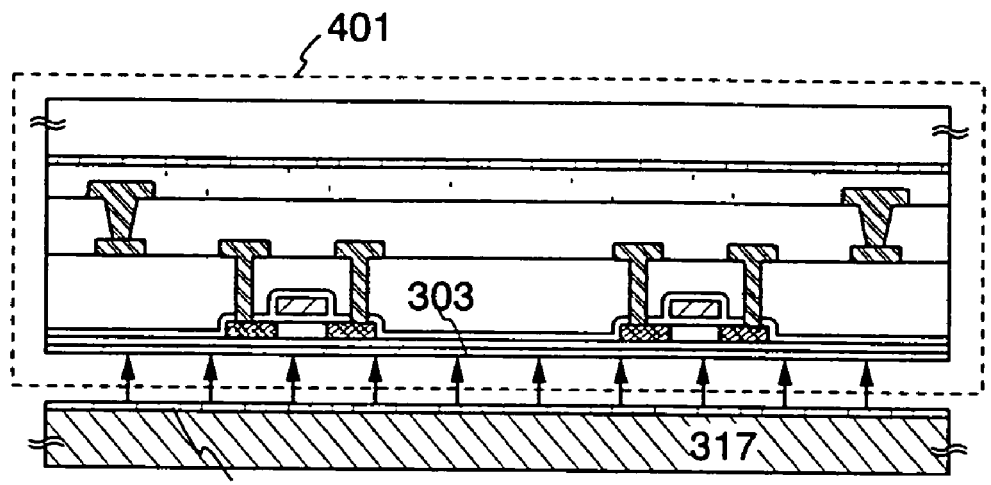
FIGS. 4A to 4C are explanatory views of a method for manufacturing a semiconductor chip according to the present invention.

Reference numeral 401 in FIG. 4A shows the state that is obtained by removing the remained metal oxide layer 302. In the following process, in case of fabricating another device formative layer over the device formative layer pasted to a thermal conductive substrate, this state of device formative layer (401) is used for the above described another device formative layer.

Next, a third adhesive layer 316 is fabricated, and a fourth substrate (a thermal conductive substrate) 317 is bonded to the oxide layer 303 (and a device formative layer 250 etc.) via the third adhesive layer 316 (FIG. 4A). Note that it is important that the adhesiveness of the second substrate 313 and the organic resin layer 311 bonded by the first adhesive layer 312 is greater than that of the oxide layer 303 (and the device formative layer 250 etc.) and the fourth substrate 317 bonded by the third adhesive layer 316.

As a fourth substrate (a thermal conductive substrate) 317, a glass substrate, a quartz substrate, a ceramic substrate, a silicon substrate, a metal substrate, or a stainless substrate, or the like, can be used. It is preferably to use a substrate having high thermal conductivity. Especially, it is preferably to use a ceramic substrate that contains aluminum oxide (alumina), aluminum nitride, aluminum nitride oxide, or silicon nitride as its main components. It is necessary that wirings for connecting electrically to a device formative layer which is stacked afterward is formed in the fourth substrate 317. As a means of forming the wirings, a known means that is used in the field of LSI for forming wirings in the substrate (also referred to as a die) on which chip is pasted can be used, so that the explanation thereof will be omitted.

A flattening film may be fabricated for preventing the device destruction and interconnection destruction in the device formative layer 250 due to irregularities of the surface of the fourth substrate 317 considering that the device formative layer according to the present invention is such a thin film having a thickness of at most 50 μm.

As a material for the third adhesive layer 316, various curing adhesives such as a photo-curing adhesive, for example, a reaction-curing adhesive, a thermal-curing adhesive, or a UV-curing adhesive, or an anaerobic adhesive can be used. More preferably, the curing adhesives is given high thermal conductivity by means of mixing powder comprising silver, nickel, aluminum, or aluminum nitride, or filler.

Figure 4B:
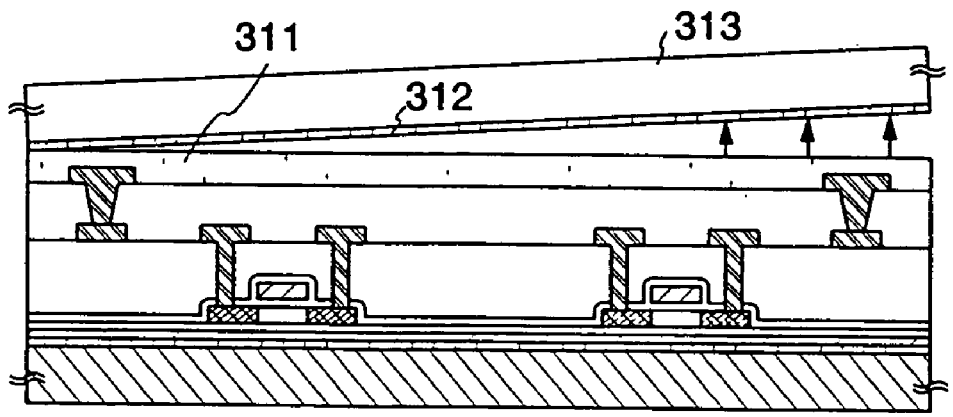

Then, UV light is irradiated from the side of the second adhesive layer 313 in order to weak the adhesiveness of the two-sided tape, secondly, the second substrate 313 is separated form the device formative layer 250 etc. (FIG. 4B.). And thirdly, the first adhesive layer 312 and the organic resin layer 311 are melted and removed by water washing the exposed surface.

A thermal conductive layer 318 is fabricated over an insulating film that is exposed its surface. The thermal conductive layer 318 may be formed of a film of aluminum nitride, aluminum nitride oxide, diamond like carbon (DLC), or the like by vapor film formation method such as sputtering, reactive sputtering, ion beam sputtering, ECR (electron cyclotron resonance) sputtering, ionization vapor deposition, or the like.

Figure 4C:
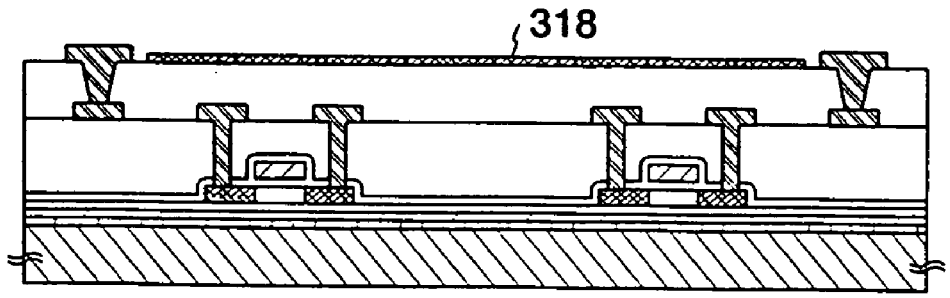

FIG. 4C shows a state that is obtained by fabricating the thermal conductive layer 318.

Figure 5A:
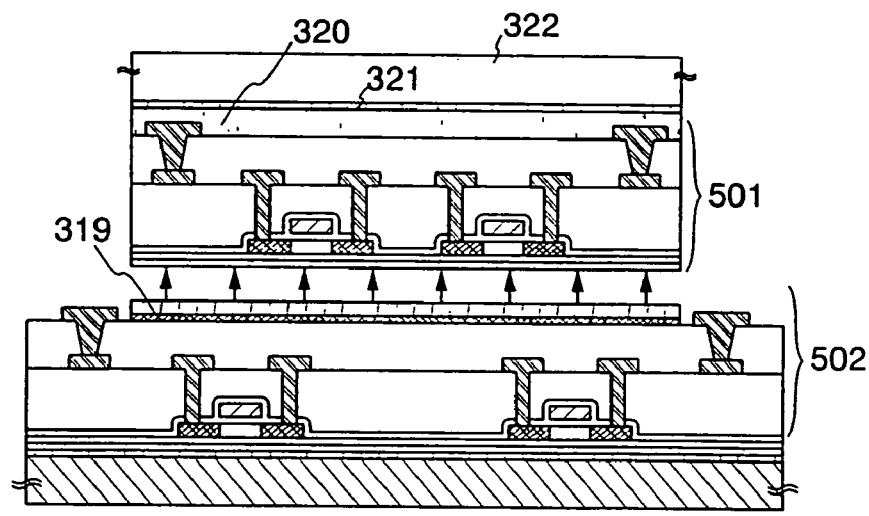
FIGS. 5A to 5C are explanatory views of a method for manufacturing a semiconductor chip according to the present invention.

Next, a fourth adhesive layer 319 is fabricated over the thermal conductive layer 318. Here, another device formative layer having a state of 401 obtained up through the process of FIG. 4A is bonded via the fourth adhesive layer 319 (FIG. 5A). In addition, another device formative layer having a state of 401 is referred to as a second device formative layer 501, and the device formative layer that is fabricate over the fourth substrate 317 is referred to as a first formative layer 502.

An organic resin layer 320, a fifth adhesive layer 321, and the fifth substrate 322 are fabricated over the second device formative layer 501. In the case of this embodiment, a device formative layer in an upper portion (501 illustrated in FIG. 5A) is necessary to be small in order not to cover an electrode pad of a device formative layer by forming the lamination structure.

Figure 5B:
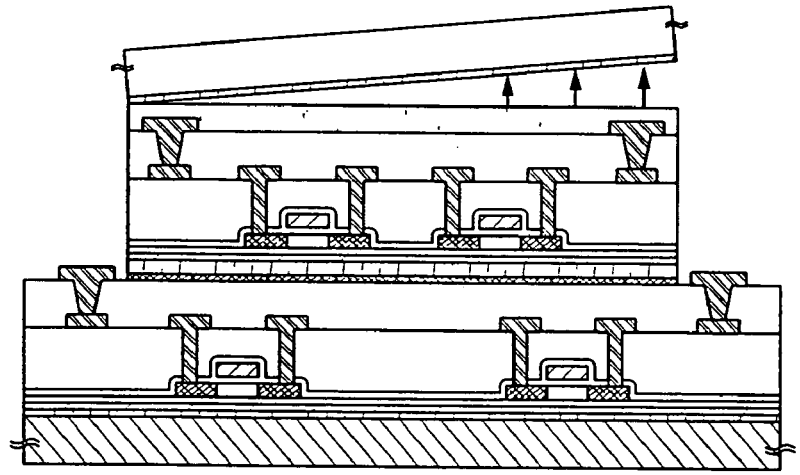

Then, UV light is irradiated from the side of the fifth adhesive substrate 322 in order to weak the adhesiveness of the two-sided tape used as the fifth adhesive layer 321, and then, the fifth substrate 322 is separated form the second device formative layer 501 (FIG. 5B). Further, the fifth adhesive layer 321 and the organic resin layer 320 are melted and removed by water washing the exposed surface.

Figure 5C:
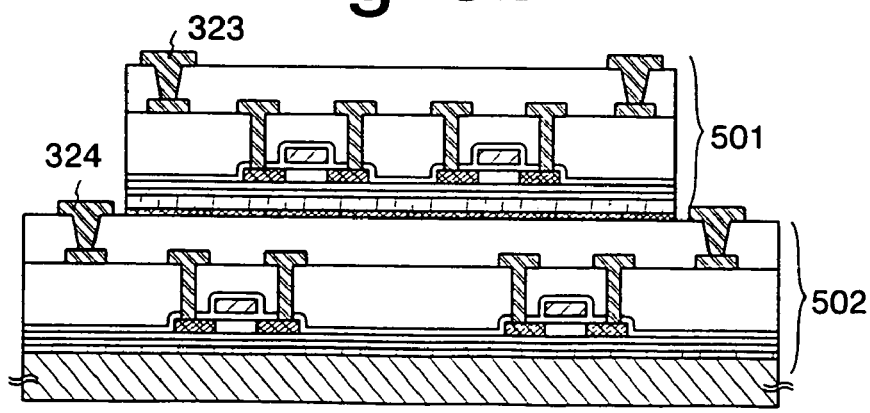

Thus, a structure in which the first device formative layer 502 and the second device formative layer 501 are stacked as shown in FIG. 5C can be formed. Within the structure shown in FIG. 5C, electrode pads (323, 324) of each device formative layer and wirings (not shown) that are provided in advance with the fourth substrate 317 having thermal conductivity are connected by a connection wire, and so the structure shown in FIGS. 1A to 1C can be formed. The connection wire may be formed of Au, Cu, Al—Si, or Au alloys.

Embodiment 2

In this embodiment, a method for manufacturing a semiconductor chip according to the present invention that has a structure described in Embodiment Mode 2 will be explained in detail with reference to FIGS. 6A to 8C.

Figure 6A:
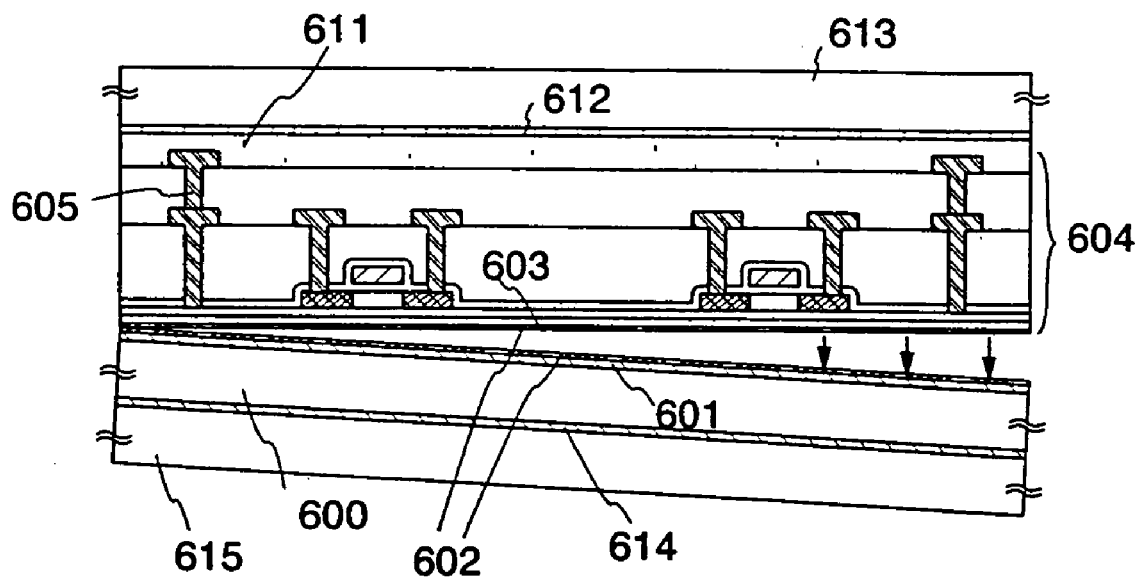
FIGS. 6A to 6C are explanatory views of a method for manufacturing a semiconductor chip according to the present invention.
Figure 6B:
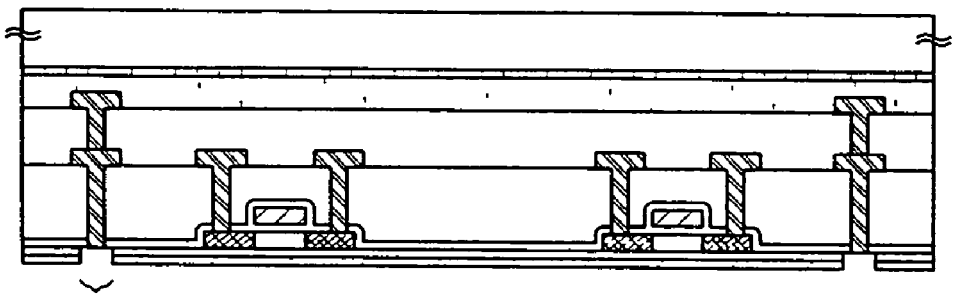

FIG. 6A shows the state that the structure having a metal layer 601, a metal oxide layer 602, an oxide layer 603, a device formative layer 604 including a plurality of TFTs or wiring, an organic resin layer 611, a first adhesive layer 612, a second substrate 613, each of which is fabricated over a first substrate 600 is formed. In addition, a third substrate 615 is pasted on the first substrate 600 via a second adhesive layer 614 which is in contact with the first substrate 600 is formed, and the metal oxide layer 602 between the metal layer 601 and the oxide layer 603 is split-off. This structure is formed by the same manner and the same material as that described in Embodiment 1 and will not be further explained here. A portion of the metal oxide layer 602 is remained over the surface exposed by separating. The remained metal oxide layer 602 may hinder the bond between the exposed surface and the substrate or the like, so that the remained metal oxide layer 602 is preferably removed. For removing the portion of the metal oxide layer 602, aqueous alkali such as aqueous ammonia or aqueous acids can be used. In addition, the following process may be carried out at the temperature (at most 430° C.) which makes it easier for the remained metal oxide layer 602 to be separated.

After separating substrates and removing the remained a metal oxide layer 602, an opening portion 606 for reaching to a wiring 605 is formed from the side of the oxide layer 603 exposed to the surface by patterning using masks formed by photolithography.

Figure 6C:
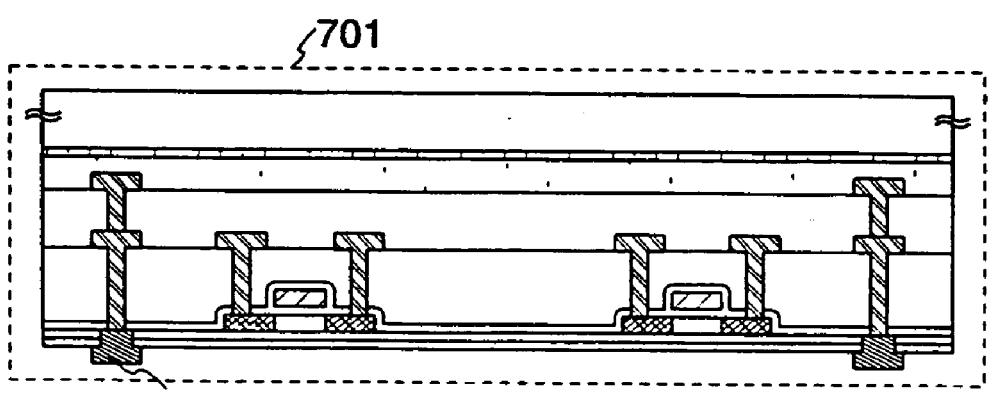

Then, an auxiliary wiring is provided with the opening portion 616 to form the structure shown in FIG. 6C. As a material for forming the wiring, an element selected from the group consisting of Ag, Au, Ta, W, Ti, Mo, Al, or Cu, or alloys or compounds containing these elements as their main components can be used. Reference numeral 701 in FIG. 6C shows a state that is completed by forming an auxiliary wiring 617. In case of fabricating another device formative layer over the device formative layer pasted on the thermal conductive substrate in the following process, this state of device formative layer (701) is used for the above described another device formative layer.

Figure 7A:
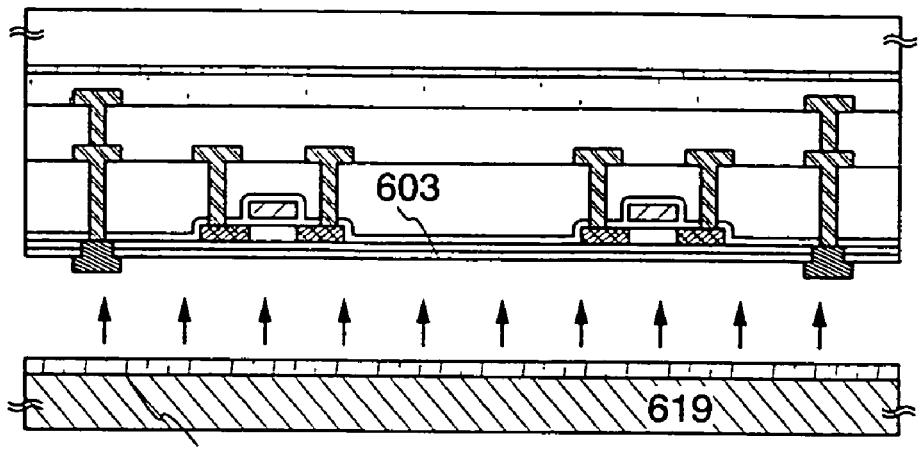
FIGS. 7A to 7C are explanatory views of a method for manufacturing a semiconductor chip according to the present invention.

Next, a third adhesive layer (anisotropic conductive adhesive layer) 618 is fabricated, and a fourth substrate (thermal conductive substrate) 619 is bonded to the oxide layer 603 (and the device formative layer 604 etc.) via the third adhesive layer 618 (FIG. 7A). Note that it is important that the adhesiveness of the second substrate 613 and the organic resin layer 611 bonded by the first adhesive layer 612 is greater than that of the oxide layer 603 (and the device formative layer 604 etc.) and the fourth substrate 619 bonded by the third adhesive layer 618.

As a fourth substrate (a thermal conductive substrate) 619, a glass substrate, a quartz substrate, a ceramic substrate, a silicon substrate, a metal substrate, or a stainless substrate, or the like, can be used. It is preferably to use a substrate having high thermal conductivity. Especially, it is preferably to use a ceramic substrate that contains aluminum oxide (alumina), aluminum nitride, aluminum nitride oxide, or silicon nitride as its main components. It is necessary that wirings for connecting electrically to a device formative layer which is stacked afterward is formed in the fourth substrate 619. As a means of forming the wirings, a known means that is used in the field of LSI for forming wirings in the substrate (also referred to as a die) on which chip is pasted can be used, so that the explanation thereof will be omitted.

As a material for fabricating the third adhesive layer (anisotropic conductive adhesive layer) 618, adhesive which is made by dispersing an anisotropic conductive material on a photo-curing adhesive such as a reaction-curing adhesive, a thermal-curing adhesive, or a UV-curing adhesive, or an anaerobic adhesive can be used. As an anisotropic conductive material, metal particles such as Ag, Au, Al, or the like coated with insulating films and having a unidirectional conductivity can be used.

Figure 7B:
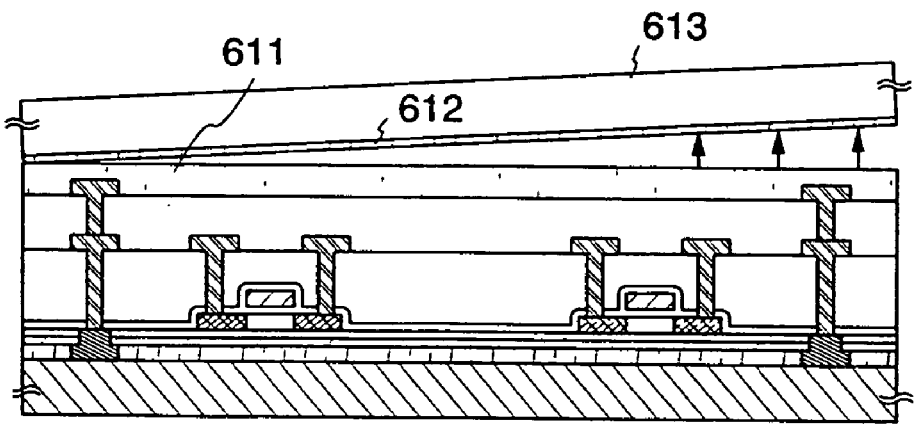

Then, UV light is irradiated from the side of the second adhesive layer 613 in order to weak the adhesiveness of the two-sided tape, and then, the second substrate 613 is separated form the device formative layer 604 (FIG. 7B). Further, the first adhesive layer 612 and the organic resin layer 611 is melted and removed by water washing the exposed surface.

A thermal conductive layer 620 is fabricated over an exposed surface of an insulating film. The thermal conductive layer 620 may be formed of a film of aluminum nitride, aluminum nitride oxide, diamond like carbon (DLC), or the like by vapor film formation method such as sputtering, reactive sputtering, ion beam sputtering, ECR (electron cyclotron resonance) sputtering, ionization vapor deposition.

Figure 7C:
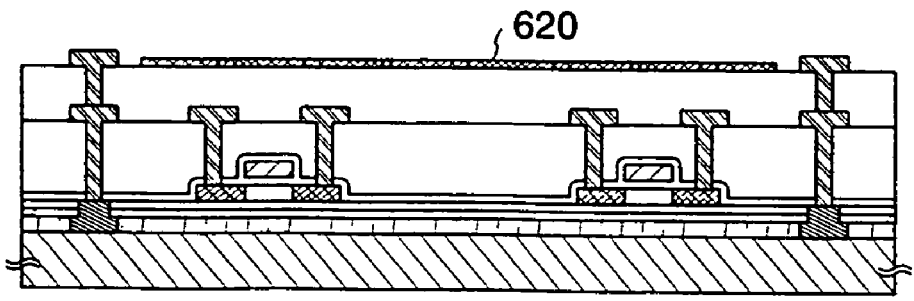

FIG. 7C shows a state that is obtained by fabricating the thermal conductive layer 620.

Figure 8A:
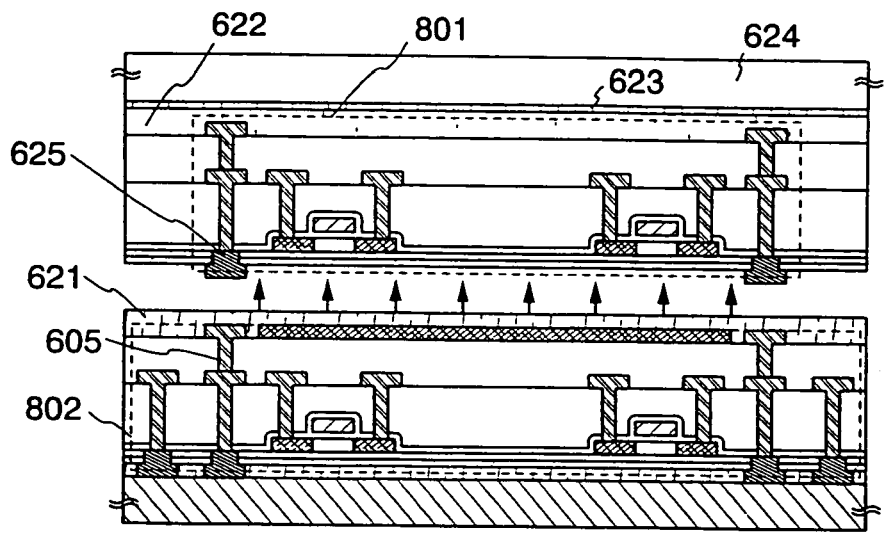
FIGS. 8A to 8C are explanatory views of a method for manufacturing a semiconductor chip according to the present invention.

Next, a fourth adhesive layer 621 is fabricated over the thermal conductive layer 620 shown in FIG. 7C. Here, another device formative layer having a state of 701 obtained up through the process of FIG. 6C is bonded thereto via the fourth adhesive layer 621 (FIG. 8A). In addition, another device formative layer having a state of 701 is referred to as a second device formative layer 801, and the device formative layer that is fabricated over the fourth substrate 619 is referred to as a first formative layer 802.

An organic resin layer 622, a fifth adhesive layer 623, and a fifth substrate 624 are fabricated over the second device formative layer 801. In the case of this embodiment, an electrode pad of a device formative layer is not used for connecting electrically as described in Embodiment 1, the wiring 605 of the first device formative layer 801 and an auxiliary wiring 625 of the second device formative layer 801 are electrically connected each other via the fourth adhesive layer (anisotropic conductive adhesive layer) 621, so that it is no problem that the sizes of each device formative layer are different from each other.

Figure 8B:
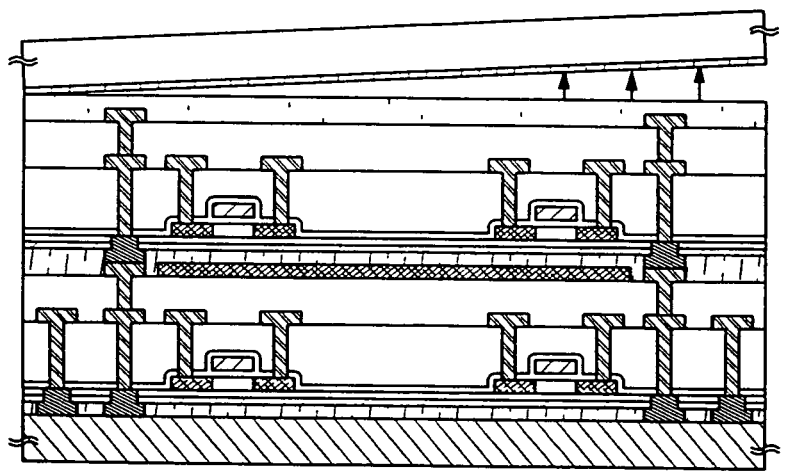

Then, UV light is irradiated in order to weak the adhesiveness of the two-sided tape used for the fifth adhesive layer 623 from the side of the fifth adhesive layer 624, and then, the fifth substrate 624 is separated from the second device formative layer 801 (FIG. 8B). Further, the fifth adhesive layer 623 and the organic resin layer 622 are melted and removed by water washing the exposed surface.

Figure 8C:
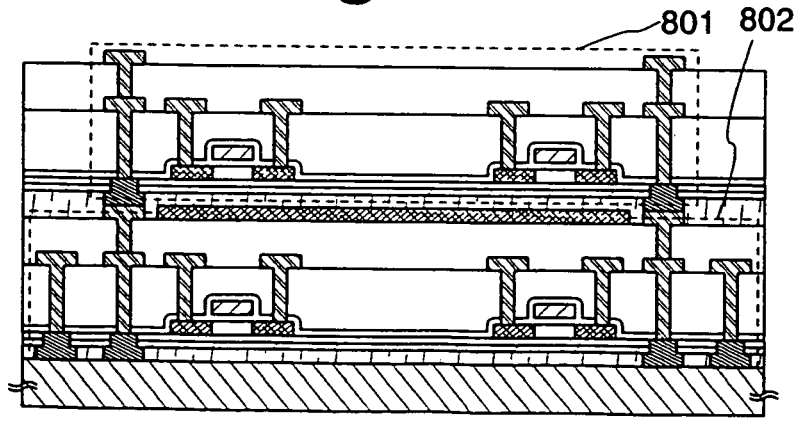

Thus, a structure in which the first device formative layer 802 and the second device formative layer 801 are stacked can be formed as shown in FIG. 8C. In this embodiment, the case that a semiconductor chip shown in FIG. 8C is formed by removing the organic resin layer, the fifth adhesive layer 623, and the fifth substrate 624 through the process shown in FIG. 8A is explained, but not exclusively, the structure obtained by bonding as shown in FIG. 8A can be used as a semiconductor chip.

Embodiment 3

In this embodiment, the structure of a semiconductor chip that has a different structure described in Embodiment 1 or 2 will be described with reference to FIGS. 17A to 18B. The structure according to this embodiment is formed by stacking a plurality of device formative layers and bonding a device formative layer which is fabricated at the very end to a thermal conductive substrate. Such structure is different from the structure described in Embodiment 1 or 2 which is formed by bonding a first device formation layer to a thermal conductive layer and stacking a plurality of device formative layers sequentially.

Figure 17A:
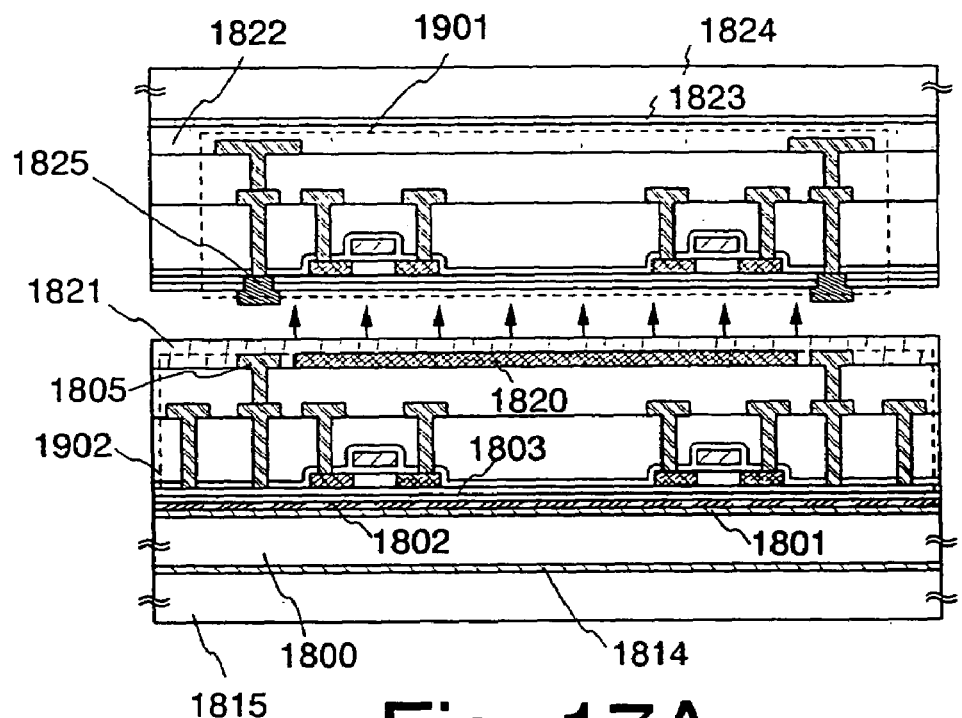
FIGS. 17A and 17B are explanatory views of a method for manufacturing a semiconductor chip according to the present invention.

As shown in FIG. 17A, a first device formative layer 1902 is fabricated over a first substrate 1800. Further, a second substrate 1815 is bonded to the first substrate 1800 via a second adhesive layer 1814.

In this embodiment, the first substrate 1800, the second adhesive layer 1814, and a second substrate 1815 is not separated by splitting-off a metal oxide layer 1802 at this point. A thermal conductive film 1820 is fabricated over a first device formation layer 1902 not to cover a wiring 1805. The thermal conductive film 1820 may be fabricated by using the same material and the same manner as the thermal conductive layer 620 in Embodiment 2.

A first adhesive layer 1821 is fabricated over the first device formative layer 1902 on which the thermal conductive film 1820 is fabricated, and a second device formative layer 1901 is bonded thereto. In addition, the first adhesive layer 1821 is an anisotropic conductive adhesive layer formed of an anisotropic conductive adhesive.

The device formative layer 1902, which is bonded here, has the same structure of the second device formative layer 801 shown in FIG. 8A in Embodiment 2. Thus, the device formative layer 1902 has an auxiliary wiring 1825 connected electrically to the wirings fabricated in the second device formative layer 1901, a third adhesive layer 1823, and a third substrate 1824. In addition, the auxiliary wiring 1825 is connected electrically to the wiring 1805 in the device formative layer 1902 via the first adhesive layer 1821.

After bonding the first device formative layer 1902 to the second device formative layer 1901, UV light is irradiated from the side of the third substrate 1824 in order to weak the adhesiveness of the two-sided tape used as the third adhesive layer 1823, secondly, the third substrate 1824 is separated form the second device formative layer 1901. And thirdly, the third adhesive layer 1823 and the organic resin layer 1822 are melted and removed by water washing the exposed surface.

A bump 1826 is formed over the surface of the second device formative layer 1901 in contact with the exposed wiring, and a fourth substrate 1827 having thermal conductivity is bonded thereto via a fourth adhesive layer 1828 formed of an anisotropic adhesive. As a material for forming the bump 1826, tungsten (W), tungsten-rhenium (W—Re), palladium (Pd), beryllium copper (BeCu), or the like can be used.

Figure 17B:
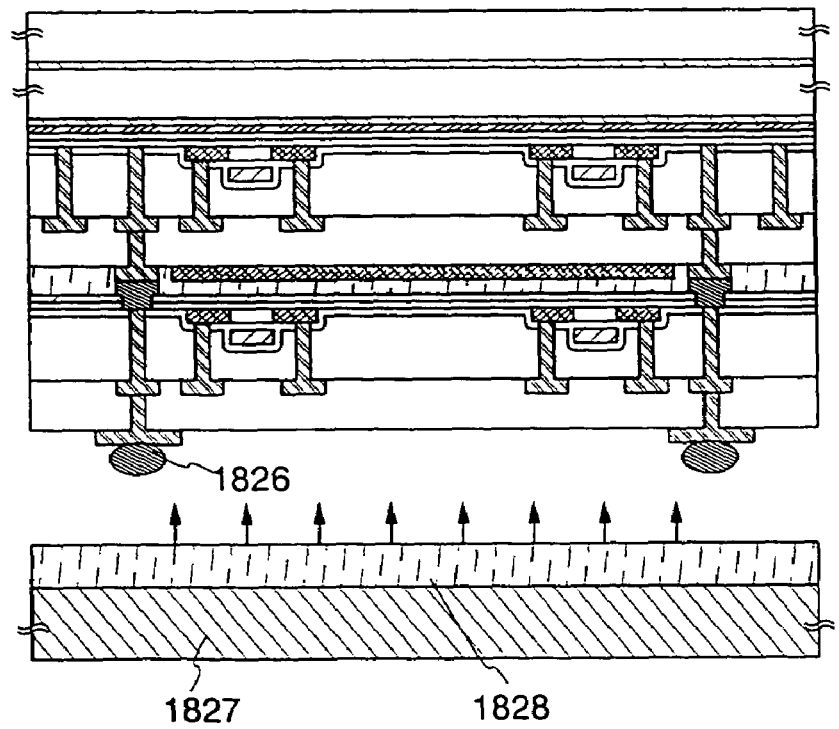

As a fourth substrate 1827, a glass substrate, a quartz substrate, a ceramic substrate, a silicon substrate, a metal substrate, or a stainless substrate, or the like, can be used. It is preferably to use a thermal substrate having high thermal conductivity. Especially, it is preferably to use a ceramic substrate that contains aluminum oxide (alumina), aluminum nitride, aluminum nitride oxide, or silicon nitride as its main components. A wiring for electrical connections via the wirings of the second device formative layer 1901 and the bump 1826 is necessary to be formed. As a means of forming the wirings, a known means that is used in the field of LSI for forming wirings in the substrate (also referred to as a die) on which chip is pasted can be used, so that the explanation thereof will be omitted. FIG. 17B shows the state that the lamination structure of a device formation layer shown in FIG. 17A is reversed.

The first substrate 1800, the second adhesive layer 1814, and the second substrate 1815 are separated by splitting-off the metal oxide layer 1802 between the metal layer 1801 and the oxide layer 1803 by the same way described with reference to FIG. 6A in Embodiment 2.

In this embodiment, the metal oxide layer 1802 remained over the second device formative layer 1901 is removed by using aqueous alkali such as aqueous ammonia or aqueous acids. This removing treatment may be carried out according to need.

Figure 18A:
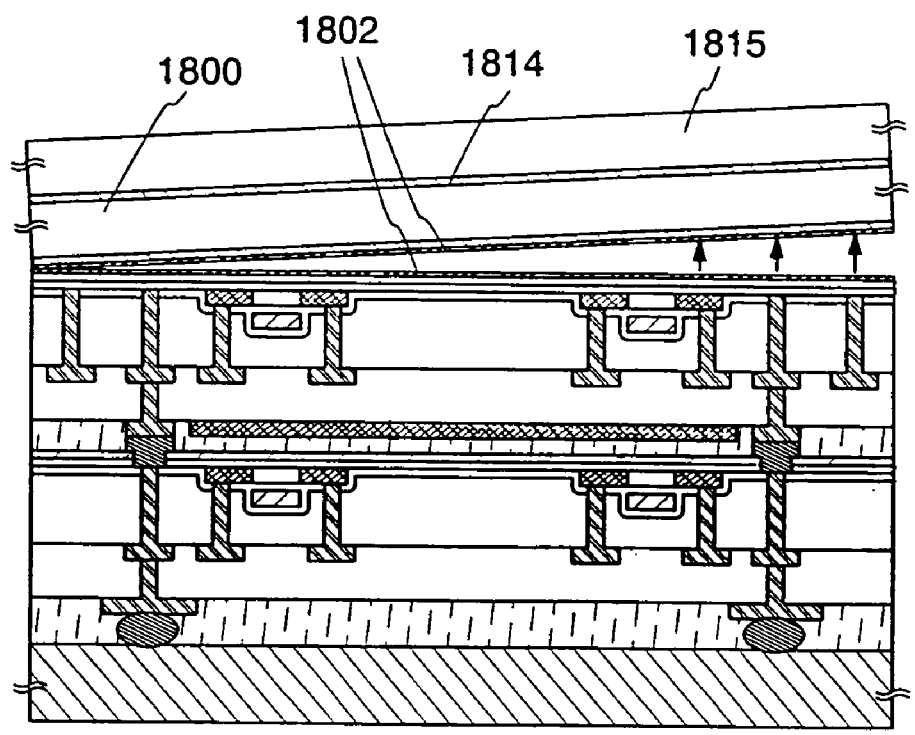
FIGS. 18A and 18B are explanatory views of a method for manufacturing a semiconductor chip according to the present invention.
Figure 18B:
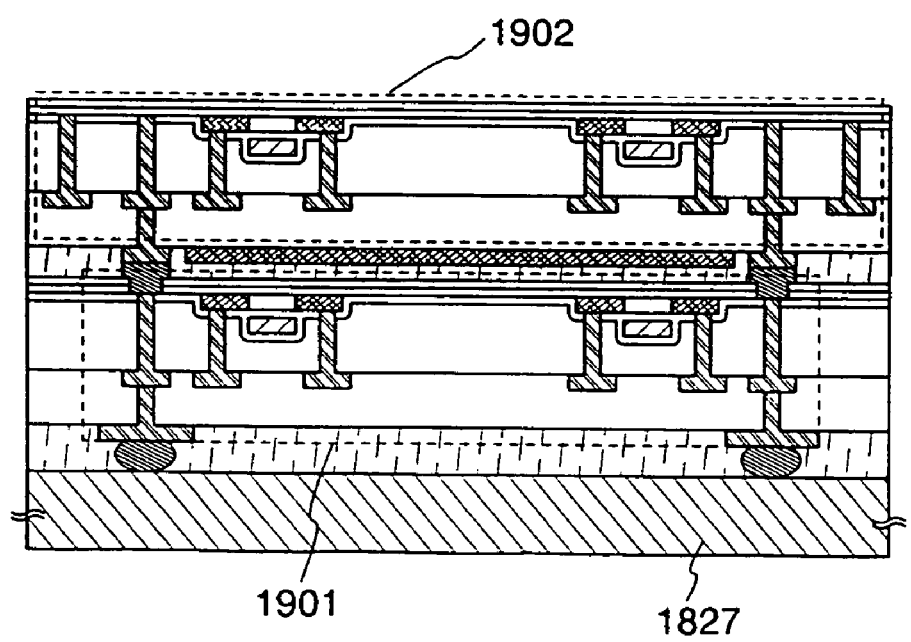

Thus, a structure, which is different from that described in Embodiment 1 or 2, in which the second device formative layer 1902 and the second device formative layer 1901 are stacked over a thermal conductive substrate (the fourth substrate 1827) can be formed as shown in FIG. 18B.

Embodiment 4

Figure 9A:
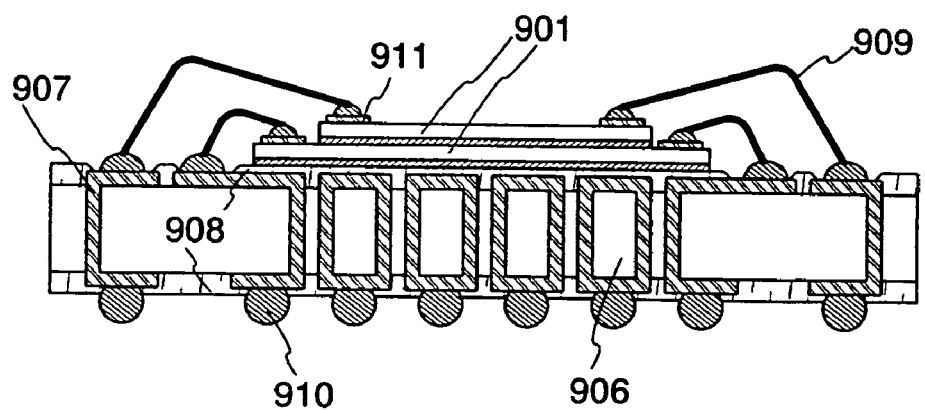
FIGS. 9A and 9B are explanatory views of the structures of semiconductor chips according to the present invention.
Figure 9B:
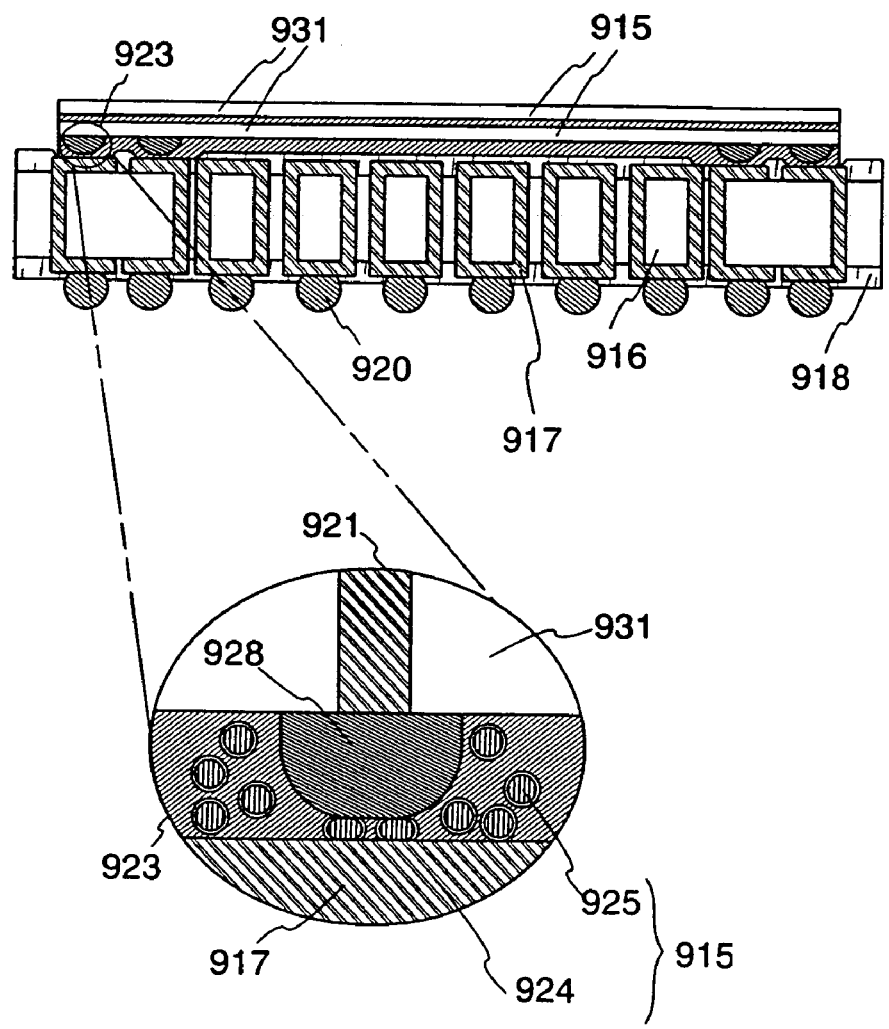

In this embodiment, a specific structure in which a device composed of TFTs included in a plurality of device formative layers stacked over a thermal conductive layer can be electrically connected to the outside via a wiring formed in a thermal conductive layer and solder balls 910 and 920 within a semiconductor chip according to the present invention comprising a plurality of device formative layers over a thermal conductive substrate will be described with reference to FIGS. 9A and 9B. FIG. 9A shows a structure of the semiconductor chip described in Embodiment Mode 1. FIG. 9B shows a structure of the semiconductor chip described in Embodiment Mode 2.

FIG. 9A shows a semiconductor chip having an interconnection structure of wire bonding. An electrode pad 911 connected electrically to a wiring of each device formative layer 901 is connected electrically to a thermal conductive substrate 906 by a connection wire 909 in the semiconductor chip. The device formative layer 901 is formed by the same way described in Embodiment 1.

A wiring 907, which penetrates the substrate, is formed in the opening portion of the thermal conductive substrate 906. An insulating layer 908 is fabricated over the both surface of the thermal conductive substrate with leaving a part of these wirings 907.

The wiring 907, which is not covered by the insulating layer 908, is connected electrically to the electrode pad 901 of each device formative layer via the connection wire 909. The solder ball 910 is formed over the face of the thermal conductive layer 906 which is not bonded with the device formative layer 911.

Electrical interconnection can be obtained by pasting the semiconductor chip shown in FIG. 9A on a wiring board (printed wiring board) with aligning so as the wirings on the wiring board to be in contact with the solder ball 910.

The semiconductor chip shown in FIG. 9B has an interconnection structure of flip chip. A wiring and an auxiliary wiring of each device formative layer 931 are electrically connected each other by an anisotropic conductive adhesive layer. In the device formative layer 931 described in this embodiment, a plurality of wirings are leaded out by a leading out wiring 921, a bump 928 is formed in contact with the leading out wiring 921, and the bump 928 is electrically connected to the wiring 917 via an anisotropic conductive adhesive layer 915 as shown in the bottom side of FIG. 9B, which is an enlarged view of 923 in the upper side of FIG. 9B. This structure is different from that described in Embodiment 2.

As a material for fabricating the anisotropic conductive adhesive layer 915, the same material for the anisotropic conductive adhesive layer in Embodiment 2 can be used. That is, the anisotropic conductive adhesive layer 915 is formed of an anisotropic conductive particle 925 made of metal particles such as Ag, Au, Al, or the like coated with insulating films and having a unidirectional conductivity and an adhesive 924 such as a photo-curing adhesive, for example, a reaction-curing adhesive, a thermal-curing adhesive, or a UV-curing adhesive, or an anaerobic adhesive. The bump 928 and the wiring 917 can be electrically connected via anisotropic conductive particle 925.

Over a thermal conductive substrate 916 on which a device formative layer is stacked, a solder ball 920 formed of a conductive material is formed in contact with the wiring 917 penetrating the substrate and the insulator 918 is formed in the opening portion as in the case of FIG. 9A.

Electrical interconnection can be obtained by pasting the semiconductor chip shown in FIG. 9B on a wiring substrate (printed wiring board) with aligning so as the wirings on the wiring substrate to be in contact with the solder ball 920.

Embodiment 5

Figure 10:
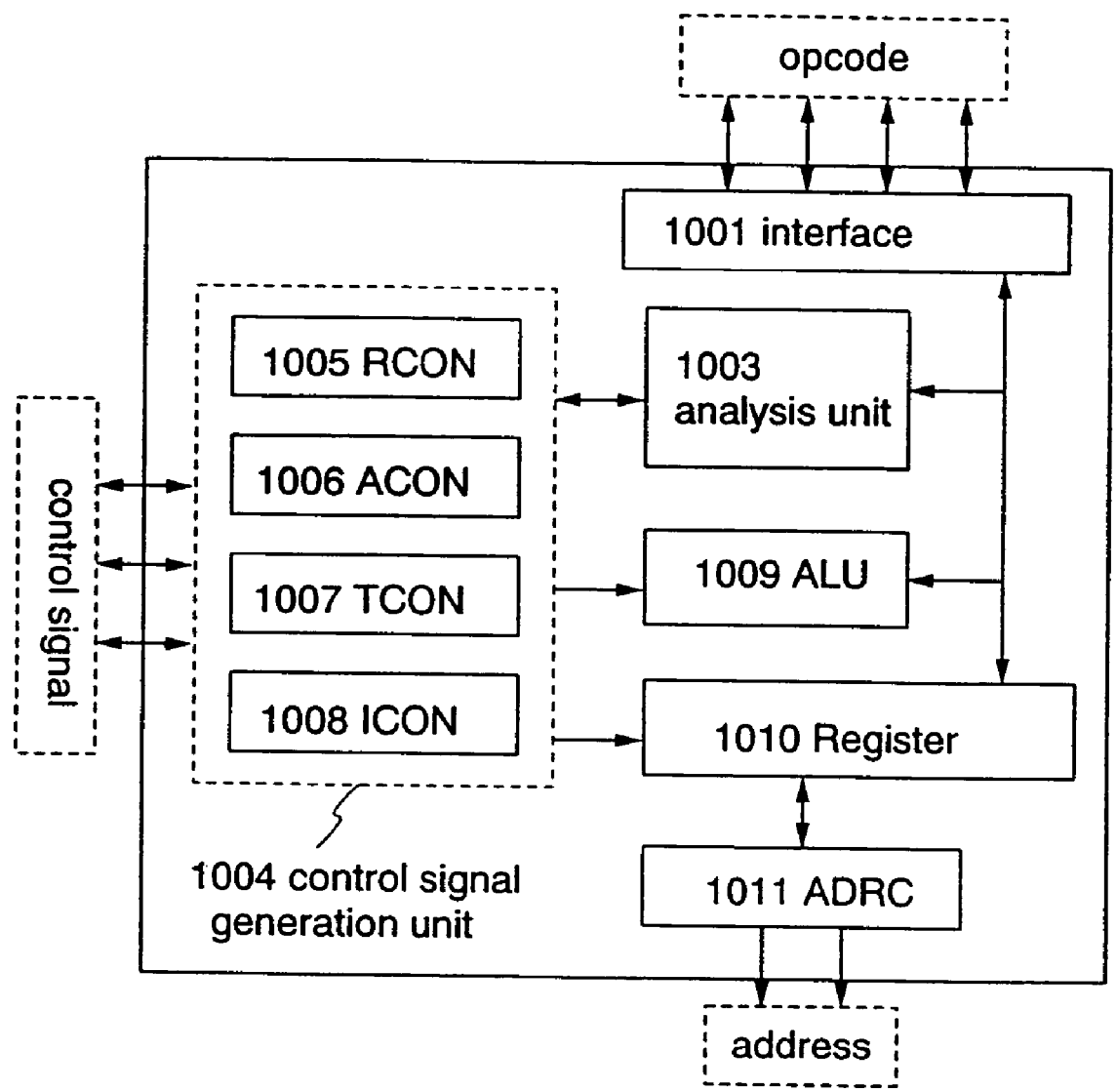
FIG. 10 is an explanatory view of a structure of a CPU included in a semiconductor chip according to the present invention.

An operation and a structure of a chip pasted over a thermal conductive substrate in case that the chip has a function as a CPU will be described with reference to FIG. 10 in this embodiment.

When an opcode is inputted to an interface 1001, the code is decrypted in an analysis unit 1003 (also referred to as an Instruction Decoder), and a signal is inputted to a control signal generation unit 1004 (a CPU Timing Control). Upon inputting the signal, a control signal is outputted from the control signal generation unit 1004 to an arithmetic logical unit 1009 (hereinafter, an ALU) and a register unit 1010 (hereinafter, a Register).

The control signal generation unit 1004 comprises an ALU controller 1006 for controlling the ALU 1009 (hereinafter, ACON), a unit 1005 for controlling the Register 1010 (hereinafter, a RCON), a timing controller 1007 for controlling timing (hereinafter, a TCON), and an interruption controller 1008 for controlling interruption (hereinafter, an ICON).

On the other hand, when an operand is inputted to the interface 1001, the operand is outputted to the ALU 1009 and the Register 1010. Then, a processing such as a memory read cycle, a memory write cycle, an I/O read cycle, an I/O write cycle, or the like, based on a control signal, which is inputted from the control signal generation unit 1004, is carried out.

The Register 1010 is composed of a general resister, a stack pointer (SP), a program counter (PC), or the like.

An address controller 1011 (hereinafter, ADRC) outputs 16 bits address.

A structure of CPU described in this embodiment is illustrative only as a CPU included in the semiconductor chip according to the present invention and does not limit the structure of the present invention. Therefore the semiconductor chip according to the present invention can be completed by using a known CPU with the structure other than that of the present invention.

Embodiment 6

Figure 11:
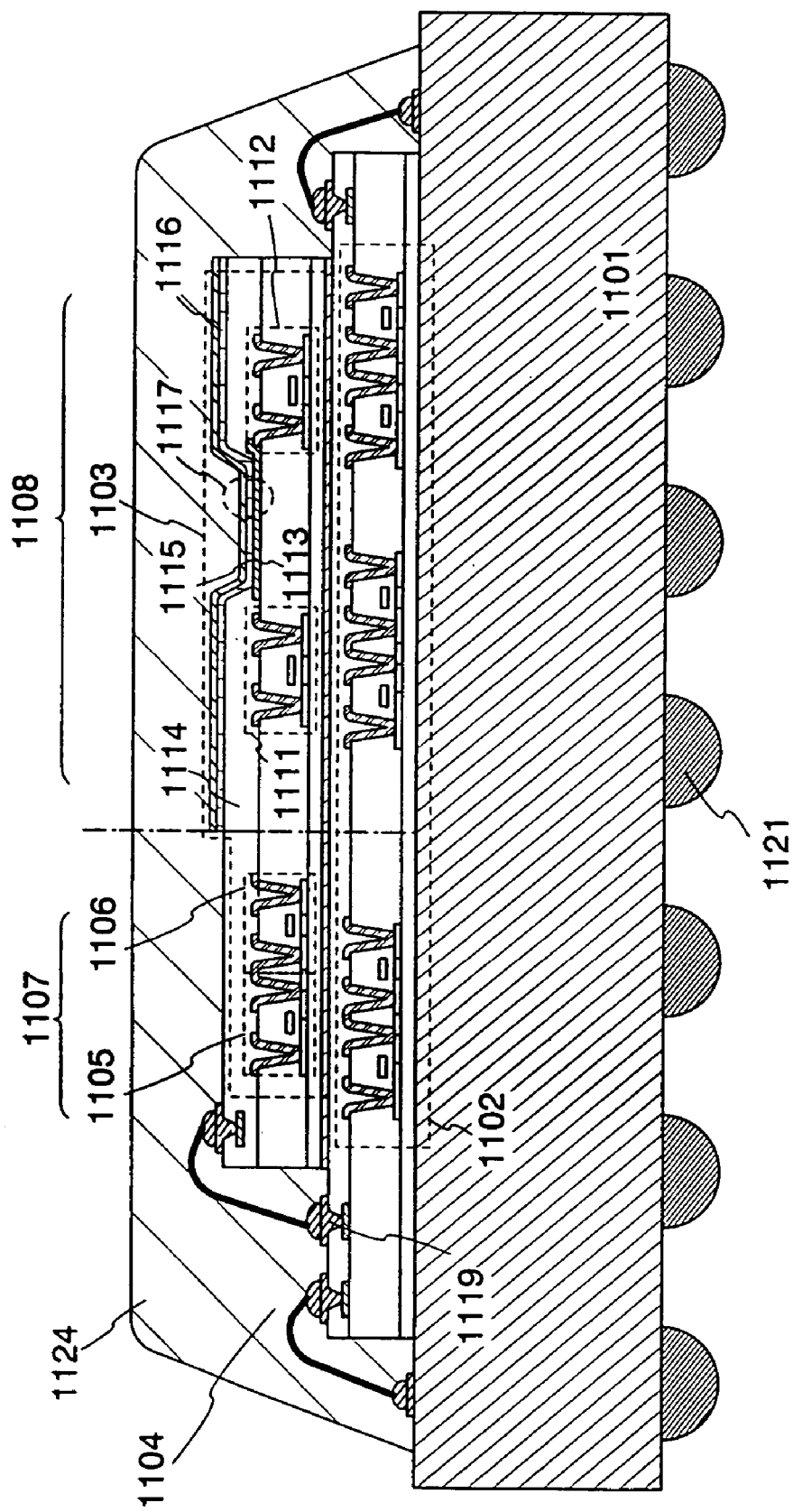
FIG. 11 is an explanatory view of the embodiment of a semiconductor chip according to the present invention.

The structure of a semiconductor chip in which a CPU and a light-emitting device are stacked will be described with reference to a cross-sectional structure in FIG. 11. A first device formative layer 1102 fabricated over a thermal conductive layer 1101 comprises a CPU. A second device formative layer 1103 comprises a light-emitting apparatus. And these layers are connected each other by a connection wire 1104.

The CPU included in the first device formative layer 1102 can adopt the structure described in Embodiment 4 and will not be further explained.

The light-emitting apparatus included in the second device formative layer 1103 is composed of a drive circuit portion 1107 (a source side drive circuit or a gate side drive circuit) formed of a CMOS circuit which is a combination of n-channel TFTs 1105 and p-channel TFTs 1106, and a pixel portion 1108.

In addition, a TFT for forming a drive circuit may be formed of a known CMOS circuit, PMOS circuit, or NMOS circuit. A driver integrated type formed by forming a drive circuit portion and a pixel portion over one device formative layer is described in this embodiment, but not exclusively, the drive circuit portion may be stacked over another device formative layer.

The pixel portion 1108 is composed of a plurality of pixels including a switching TFT 1111, a current control TFT 1112, and a first electrode 1113 connected electrically to the drain of the current control TFT 1112. An insulator 1114 is formed to cover the edge portion of the first electrode 1113.

An electroluminescent device 1117 is composed of a first electrode 1113, a second electrode 1116, and an electroluminescent layer 1115 which is interposed between these electrodes. As a material for forming the first electrode 1113, a material having large work function is preferably used. For example, a single layer such as a titanium nitride film, a chrome film, a tungsten film, a Zn film, or Pt film; a lamination layer of a titanium nitride film and a film containing aluminum as its main components; or a three lamination layer of a titanium nitride film, a film containing aluminum as its main components, and a titanium nitride film, are useful. By forming the first electrode to have a lamination structure, resistance as a wiring can be low, good properties of ohmic contact can be obtained, and the first electrode can serve as an anode.

The electroluminescent layer 1115 can be fabricated by vapor deposition using an evaporation mask or ink-jetting.

As a material for the second electrode (cathode) 1116 formed over the electroluminescent layer 1115, a small work function material (Al, Ag, Li, Ca, or alloy of these materials such as MgAg, MgIn, AlLi, $CaF_2$, or CaN) is useful. Here, the second electrode (cathode) 1116 is formed of a lamination of a thin metal film, a transparent conductive film (Indium-tin-oxide (ITO), indium oxide-zinc oxide ($In_2O_3$—ZnO), zinc oxide (ZnO), or the like) in order light to pass through the second electrode.

Thus, the second device formative layer 1103 including a light-emitting device is stacked over the first device formative layer 1102 including a CPU, and these two layers are connected each other by the electrode pad 1119 using the connection wire 1104, then, these two layers are encapsulated by a resin 1120. In addition, a material for the resin 1124, a thermosetting resin or a thermoplastic resin can be used. Specifically, a mold resin such as an epoxy resin, a silicon resin, a PPS resin (polyphenylene sulfide resin), or the like can be used.

Though not shown in the figure, wirings that are connected to the first device formative layer 1102 and the second device formative layer 1103 are provided with the thermal conductive substrate 1101. In addition, the thermal conductive substrate can connect to the outside via a solder ball 1121 which is connected to the wiring.

Embodiment 7

Embodiments of the present invention will be described with reference to FIGS. 12A to 13D. Hereinafter, a method for fabricating simultaneously an n-channel TFT and a p-channel TFT over one substrate will be described in detail.

A quartz substrate, a semiconductor substrate, a ceramic substrate, a metal substrate, or the like, may be used as a substrate 1200. In this embodiment, a glass substrate (#1737) is used for the substrate 1200. First, a silicon oxynitride layer is fabricated to have a thickness of 100 nm over the substrate 1200 by PCVD as a nitride layer 1201.

Subsequently, a tungsten layer is fabricated to have a thickness of 50 nm by sputtering as a metal layer 1202, and a silicon oxide layer is fabricated to have a thickness of 200 nm continuously by sputtering as an oxide layer 1203 without being exposed to the atmosphere. The silicon oxide layer is fabricated under the condition, that is, using a RF sputtering device; using a silicon target (diameter is 30.5);

flowing a heated argon gas at a flow rate of 20 sccm for heating the substrate; setting the substrate temperature at 270° C.; the pressure of film formation of 0.4 Pa; the electric power of 3 kW; and argon flow rate/oxygen flow rate=10 sccm/30 sccm.

Subsequently, the tungsten layer at periphery or edges of the substrate is removed by $O_2$ ashing.

Next, a silicon oxynitride film fabricated of $SiH_4$ and $N_2O$ as material gases (composition ratio: Si=32%, O=59%, N=7%, H=2%) is stacked as a base insulating film 1204 to have a thickness of 100 nm at deposition temperature of 300° C. by plasma CVD. Further, a semiconductor layer having an amorphous configuration (here, an amorphous silicon film) is fabricated to have a thickness of 54 nm without exposure to the atmosphere using $SiH_4$ as deposition gas and at deposition temperature of 300° C. by plasma CVD. This amorphous silicon film contains hydrogen, the hydrogen will be diffused by a subsequent heat treatment, and the amorphous silicon film can be separated by splitting-off the oxide layer or the interface of the oxide layer by a physical means.

Then, nickel acetate salt solution containing nickel of 10 ppm in weight is coated using a spinner. Instead of the coating, a method for spraying nickel elements to the entire surface by sputtering may also be used. Then, heat treatment is carried out for crystallization to fabricate a semiconductor film having a crystalline configuration (here, a polysilicon layer is fabricated). Here, after carrying out the heat treatment (500° C. for 1 hour) for dehydrogenation, and the heat treatment (550° C. for 4 hours) for crystallization is carried out, and then, a silicon film having a crystalline configuration is fabricated. Also, the heat treatment (500° C. for 1 hour) for dehydrogenation serves as diffusing the hydrogen contained in the amorphous silicon layer into an interface between the tungsten film and silicon oxide layer. Also note that, although a crystallization technique using nickel as a metal element that promotes crystallization of silicon is used here, other known crystallization techniques, for example, a solid-phase growth method or a laser crystallization method, may be used.

Next, after the oxide film on the surface of the silicon film having a crystalline configuration is removed by dilute hydrofluoric acid or the like, laser beam (XeCl: wavelength of 308 nm) is irradiated for raising a crystallization rate and repairing defects remaining in crystal grains in the atmosphere or in the presence of oxygen. Excimer laser beam with a wavelength of at most 400 nm, or second harmonic wave or third harmonic wave of a YAG laser is used as the laser beam. In any case, pulse laser beam with a repetition frequency of approximately from 10 to 1000 Hz is used, the pulse laser beam is condensed to from 100 to 500 mJ/cm$^2$ by an optical system, and irradiation is performed with an overlap ratio of from 90 to 95%, whereby the silicon film surface may be scanned. Here, laser beam is irradiated in the atmosphere with a repetition frequency of 30 Hz and energy density of 470 mJ/cm$^2$.

Note that an oxide film is fabricated over the surface since laser beam is irradiated in the atmosphere or in the presence of oxygen. Though an example of using the pulse laser is shown here, the continuous oscillation laser may also be used. When a crystallization of an amorphous semiconductor film is carried out, it is preferable that the second harmonic through the fourth harmonic of basic waves are applied by using the solid state laser which is capable of continuous oscillation in order to obtain a crystal in large grain size. Typically, it is preferable that the second harmonic (with a thickness of 532 nm) or the third harmonic (with a thickness of 355 nm) of an Nd: YVO$_4$ laser (basic wave of 1064 nm) may be applied. Specifically, laser beams emitted from the continuous oscillation type YVO$_4$ laser with 10 W output is converted into a harmonic by using the non-linear optical elements. Also, a method for emitting a harmonic by applying crystal of YVO$_4$ and the non-linear optical elements into a resonator can be applied. Then, more preferably, the laser beams are formed to have a rectangular shape or an elliptical shape by an optical system and a substance is exposed to the laser beam. At this time, the energy density of approximately from 0.01 to 100 MW/cm$^2$ (preferably, from 0.1 to 10 MW/cm$^2$) is required. The semiconductor film is moved at approximately from 10 to 2000 cm/s rate relatively corresponding to the laser beams so as to be exposed to the laser beam.

In addition to the oxide film fabricated by this laser beam irradiation, a barrier layer is fabricated of the oxide film by treating the surface of the oxide film with ozone water for 120 seconds to have a thickness of from 1 to 5 nm in total. Though the barrier layer is fabricated by using ozone water here, another method such as ultraviolet light irradiation in the presence of oxygen or oxide plasma treatment for oxidizing the surface of the semiconductor film having the crystal structure may be used. In addition, as another method for fabricating the barrier layer, an oxide film having a thickness of approximately from 1 to 10 nm may be deposited by plasma CVD, sputtering, vapor deposition, or the like. Further, prior to fabricating the barrier layer, the oxide film fabricated by laser beam irradiation may be removed.

Over the barrier layer, an amorphous silicon film containing argon elements, which serve as a gettering site, is fabricated by sputtering to have a thickness of from 10 to 400 nm, here, 100 nm. In this embodiment, an amorphous silicon film containing argon is formed under the atmosphere containing argon with using a silicon target. In case of fabricating an amorphous silicon film containing argon elements by plasma CVD, it is formed under the condition, that is, a flow ratio of monosilane to argon is controlled to be 1/99; a pressure during deposition to be 6.665 Pa (0.05 Torr); a RF power density during deposition to be 0.087 W/cm$^2$; and a deposition temperature to be 350° C.

Then, an oven heated at 650° C. is used for heat treatment for 3 minutes for gettering to lower the nickel concentration in the semiconductor film having a crystal structure. A lamp annealing apparatus may be used instead of the oven.

Subsequently, the amorphous silicon film containing argon elements, which serve as a gettering site, is selectively removed using the barrier layer as an etching stopper, and then, the barrier layer is selectively removed by dilute hydrofluoric acid. Note that there is a tendency that nickel moves toward a region with a high oxygen concentration during gettering, and thus, it is desirable that the barrier layer fabricated of the oxide film is removed after gettering.

Then, after a thin oxide film is fabricated by using ozone water on the surface of the obtained silicon film having a crystal structure (also referred to as a polysilicon film), and a mask formed of resist is formed, then island-like semiconductor layers 1205 and 1206 isolated in island shapes are fabricated by etching to have desired shapes. After fabricating the semiconductor layers 1205 and 1206, the mask formed of resist is removed.

Through the above processes, a nitride layer 1201, a metal layer 1202, an oxide layer 1203, and a base insulating film 1204 are fabricated on a substrate 1200, and a semiconductor film having a crystal structure is fabricated, then, semiconductor layers 1205 and 1206 isolated in island shapes are fabricated by etching to have desired shapes.

Figure 12A:
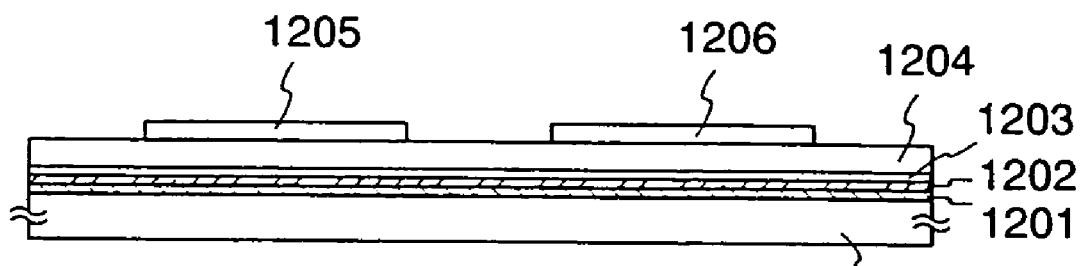
FIGS. 12A to 12D are explanatory views of a manufacturing process of TFTs.
Figure 12B:
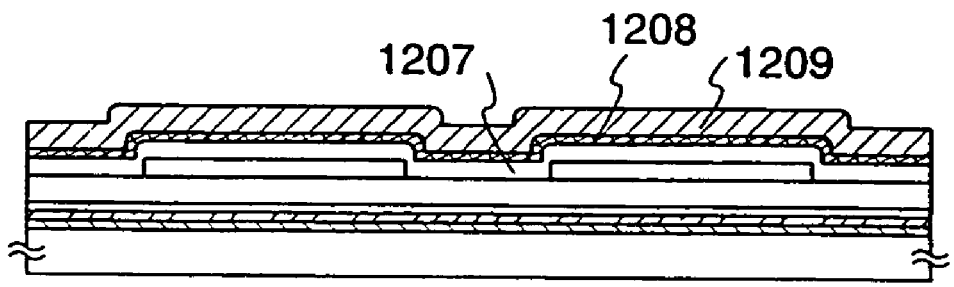

Then, the oxide film is removed with the etchant containing hydrofluoric acid, and at the same time, the surface of the silicon film is cleaned. Thereafter, an insulating film containing silicon as its main components, which serves as a gate insulating film 1207, is fabricated. In this embodiment, a silicon oxynitride film (composition ratio: Si=32%, O=59%, N=7%, H=2%) is fabricated with a thickness of 115 nm by plasma CVD (FIG. 12B).

Next, a first conductive film 508 with a thickness of from 20 to 100 nm and a second conductive film 1209 with a thickness of from 100 to 400 nm are stacked over the gate insulating film 1207. In this embodiment, tantalum nitride film with a thickness of 50 nm and a tungsten film with a thickness of 370 nm are sequentially stacked over the gate insulating film 1207.

As a conductive material for fabricating the first conductive film 1208 and the second conductive film 1209, an element selected from the group consisting of Ta, W, Ti, Mo, Al and Cu, or an alloy material or a compound material containing the above elements as its main components is used. Further, as a first conductive film 1208 and a second conductive film 1209, a semiconductor film as typified by a polycrystal silicon film added with an impurity element such as phosphorous, or an AgPdCu alloy may be used. Further, the present invention is not limited to a two-layer structure. For example, a three-layer structure may be adopted in which a tungsten film having a thickness of 50 nm, an alloy film of aluminum and silicon (Al—Si) having a thickness of 500 nm, and a titanium nitride film having a thickness of 30 nm are sequentially stacked. Moreover, in case of a three-layer structure, tungsten nitride may be used instead of tungsten of the first conductive film, an alloy film of aluminum and titanium (Al—Ti) may be used instead of the alloy film of aluminum and silicon (Al—Si) of the second conductive film, and a titanium film may be used instead of the titanium nitride film of the third conductive film. In addition, a single layer structure may also be adopted.

Figure 12C:
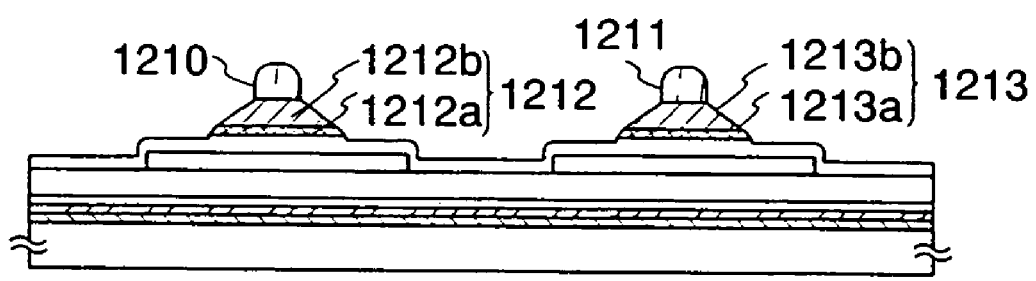
Figure 12D:
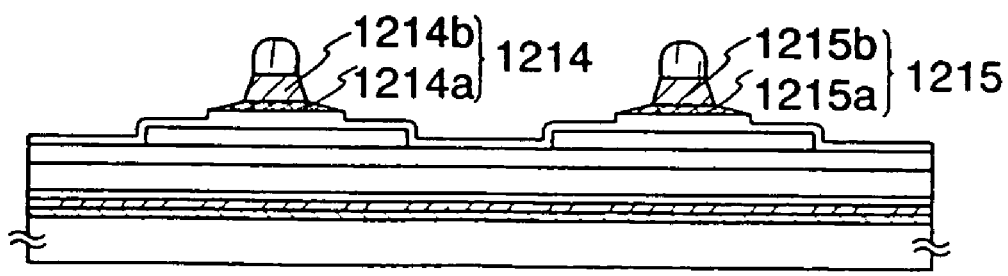

Next, resist masks 1210, 1211 are formed in a light exposure process as shown in FIG. 12C. Then, a first etching treatment is carried out for forming gate electrodes and wirings. The first etching treatment is carried out under first and second etching conditions. ICP (inductively coupled plasma) etching is preferably used. The films can be etched to have desired taper shapes by using ICP etching and suitably adjusting the etching conditions such as the amount of power applied to a coiled electrode, the amount of power applied to an electrode on the substrate side, the temperature of the electrode on the substrate side, etc. As etching gas, chlorine-based gas as typified by $Cl_2$, $BCl_3$, $SiCl_4$, or $CCl_4$, fluorine-based gas as typified by $CF_4$, $SF_6$, or $NF_3$, or $O_2$ can be appropriately used.

In this embodiment, RF (13.56 MHz) power of 150 W is applied also to the substrate (sample stage) to substantially apply a negative self-bias voltage. The electrode area to the substrate side is 12.5 cm×12.5 cm, and the coil-shape electrode area (quartz disc formed coil is described here) is 25 cm diameter disc. The W film is etched so as to form the edge portions of the first conductive layer in a taper shape under the first etching conditions. An etching rate to W is 200.39 nm/min, an etching rate to TaN is 80.32 nm/min, and the selective etching ratio of W to TaN is approximately 2.5 under the first etching conditions. Further, a taper angle of W becomes approximately 26° under the first etching conditions. Thereafter, the first etching conditions are changed to the second etching conditions without removing the masks 1210, 1211 formed of resist. $CF_4$ and $Cl_2$ are used as etching gases, the flow rate of the gas is set to 30/30 sccm,
and RF (13.56 MHz) power of 500 W is applied to a coil-shape electrode with a pressure of 1 Pa to generate plasma, thereby performing etching for about 30 seconds. RF (13.56 MHz) power of 20 W is also applied to the substrate side (sample stage) to substantially apply a negative self-bias voltage. Both the W film and the TaN film are etched at the same level under the second etching conditions in which $CF_4$ and $Cl_2$ are mixed. An etching rate to W is 58.97 nm/min, and an etching rate to TaN is 66.43 nm/min under the second etching conditions. Note that an etching time may be increased approximately to from 10 to 20% in order to etch without leaving residue over the gate insulating film.

In the first etching treatment as described above, the shape of the mask formed of resist is formed into an appropriate shape whereby each the edge portion of the first conductive layer and the edge portion of the second conductive layer is fabricated to have a tapered shape due to the effect of bias voltage applied to the substrate side. The angle of the tapered portion may be set ranging from 15 to 45°.

Thus, first shape conductive layers 1212 and 1213 composed of the first conductive layer and the second conductive layer (first conductive layers 1212a and 1213a and second conductive layers 1212b and 1213b) are fabricated by the first etching treatment as shown in FIG. 12C. According to this, the insulating film 1207 that is not covered by the first shape conductive layers 1212 and 1213 is etched by approximately from 10 to 20 nm to be thin and fabricated into a gate insulating film 1207.

Next, a second etching treatment is carried out for 25 seconds without removing the masks formed of resist under the conditions, that is, $SF_6$, $Cl_2$ and $O_2$ are used as etching gas; the flow rate of the gas is set to 24/12/24 sccm; and RF (13.56 MHz) power of 700 W is applied to a coil-shape electrode with pressure of 1.3 Pa to generate plasma. RF (13.56 MHz) power of 10 W is also applied to the substrate side (sample stage) to substantially apply a negative self-bias voltage. In the second etching treatment, an etching rate to W is 227.3 nm/min, an etching rate to TaN is 32.1 nm/min, a selection ratio of W to TaN is 7.1, an etching rate to SiON, which serves as the insulating film 1211, is 33.7 nm/min, and a selection ration of W to SiON is 6.83. In case where $SF_6$ is used as an etching gas, the selection ratio with respect to the insulating film 1211 is high as described above. Thus, reduction in the film thickness can be suppressed. In this embodiment, the film thickness of the insulating film 1207 is reduced by only approximately 8 nm.

Through the second etching treatment, the taper angle of W can be formed into 70°. Through the second etching treatment, second conductive layers 1214b and 1215b are fabricated. On the other hand, the first conductive layers 1212a and 1213a are hardly etched and fabricated into first conductive layers 1214a, 1215a. Note that the first conductive layers 1214a, 1215a have substantially the same sizes as those of the first conductive layers 1212a, 1213a. In actuality, the width of the first conductive layer may be reduced by approximately 0.3 μm, namely, approximately 0.6 μm in total, in comparison with the first conductive layer prior to being applied with the second etching treatment. There is almost no change in size of the first conductive layer. Thus, second shape conductive layers 1214 and 1215 composed of the first conductive layer and the second conductive layer (first conductive layers 1214a and 1215a and second conductive layers 1214b and 1215b) are fabricated.

Further, instead of the two-layer structure, in case that the three-layer structure is adopted in which a tungsten film with a thickness of 50 nm, an alloy film of aluminum and silicon (Al—Si) with a thickness of 500 nm, and a titanium nitride film with a thickness of 30 nm are sequentially stacked, the first etching treatment may be carried out for 117 seconds under the conditions, that is, $BCl_3$, $Cl_2$ and $O_2$ are used as raw material gases; the flow rate of the gases are set to 65/10/5 (sccm); RF (13.56 MHz) power of 300 W is applied to the substrate side (sample stage); and RF (13.56 MHz) power of 450 W is applied to a coil-shape electrode with a pressure of 1.2 Pa to generate plasma. As to the second etching conditions in the first etching treatment, that is, $CF_4$, $Cl_2$ and $O_2$ are used; the flow rage of the gases is set to 25/25/10 sccm; RF (13.56 MHz) power of 20 W is also applied to the substrate side (sample stage); and RF (13.56 MHz) power of 500 W is applied to a coil-shape electrode with a pressure of 1 Pa to generate plasma. The first etching treatment may be carried out for approximately 30 seconds under the second etching conditions. The second etching treatment may be carried out under the conditions, that is, $BCl_3$ and $Cl_2$ are used; the flow rate of the gases are set to 20/60 sccm; RF (13.56 MHz) power of 100 W is applied to the substrate side (sample stage); and RF (13.56 MHz) power of 600 W is applied to a coil-shape electrode with a pressure of 1.2 Pa to generate plasma.

Figure 13A:
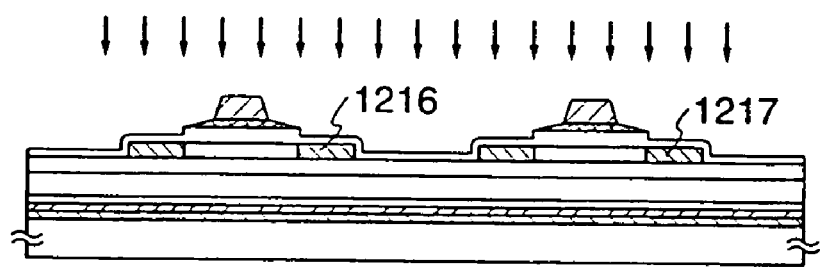
FIGS. 13A to 13D are explanatory views of a manufacturing process of TFTs.

Next, the masks formed of resist are removed, and a first doping process is carried out to obtain the state of FIG. 13A. The doping process may be carried out by ion doping or ion implantation. Ion doping is carried out under the conditions of a dosage of $1.5 \times 10^{14}$ atoms/cm$^2$ and an accelerating voltage of from 60 to 100 kV. As an impurity element imparting n-type conductivity, phosphorous (P) or arsenic (As) is typically used. In such a case, second shape conductive layers 1214, 1215 serve as masks against the impurity elements imparting n-type conductivity, and first impurity regions 1216, 1217 are formed in a self-aligning manner. The impurity element imparting n-type conductivity is added to the first impurity regions 1216, 1217 in a concentration range of from $1 \times 10^{16}$ to $1 \times 10^{17}$/cm$^3$. Here, the region having the same concentration range as the first impurity region is also referred to as an n$^{--}$ region.

Note that although the first doping process is carried out after removing the masks formed of resist in this embodiment, the first doping process may be carried out without removing the masks formed of resist.

Figure 13B:
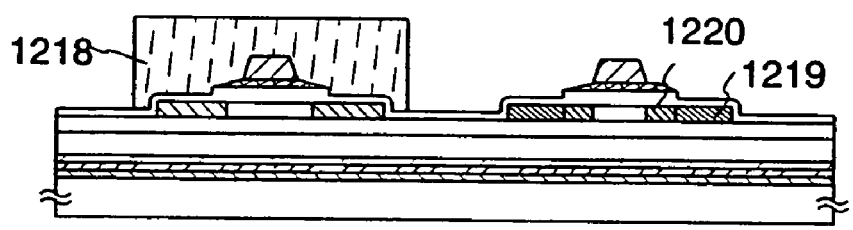

Subsequently, as shown in FIG. 13B, a mask 1218 formed of resist is formed, and a second doping process is carried out. The mask 1218 protects a channel forming region and the periphery thereof of a semiconductor layer forming p-channel TFTs.

The second doping process of phosphorous (P) is carried out under the conditions, that is, a dosage of $1.5 \times 10^{15}$ atoms/cm$^2$, and an accelerating voltage of 60 to 100 kV. Here, impurity regions are formed in the respective semiconductor layers in a self-aligning manner with the second conductive layers 1214b, 1215b as masks. Of course, phosphorous is not added to the regions covered by the mask 1218. Thus, second impurity region 1219 and a third impurity region 1220 are formed. The impurity elements imparting n-type conductivity are added to the second impurity region 1219 in a concentration range of $1 \times 10^{20}$ to $1 \times 10^{21}$/cm$^3$. Here, the region having the same concentration range as the second impurity region is also referred to as an n$^+$ region.

Further, the third impurity region 1220 is formed to have a lower concentration than that in the second impurity region 1219 by influenc of the first conductive layer 1215a, and is added with the impurity elements imparting n-type conductivity in a concentration range of $1 \times 10^{18}$ to $1 \times 10^{19}$/cm$^3$.

Note that the third impurity region 1220 is doped via the tapered portion of the first conductive layer so that the third impurity region 1220 produces the concentration gradient in which the impurity concentration becomes higher toward the edge portion of the tapered portion. Here, the region having the same concentration range as that of the third impurity region is referred to as an n$^-$ region.

Figure 13C:
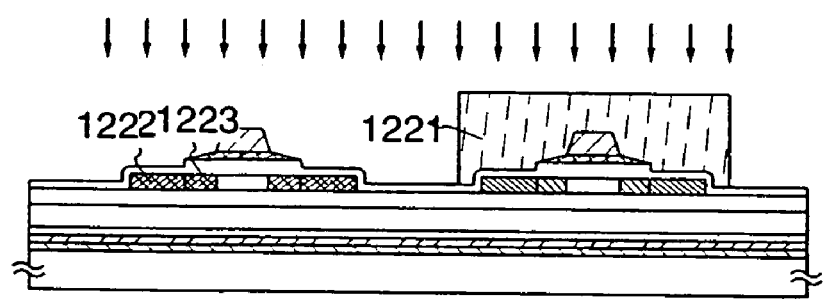

Next, after the mask 1218 formed of resist is removed, mask 1221 formed of resist is newly formed, and a third doping process is carried out as shown in FIG. 13C.

The above-described third doping process is carried out, and fourth impurity region 1222 and fifth impurity region 1223 are formed in which an impurity elements imparting p-type conductivity are added to the semiconductor layer.

Further, the impurity element imparting p-type conductivity is added to the fourth impurity region 1222 in a concentration range of from $1 \times 10^{20}$ to $1 \times 10^{21}$/cm$^3$. Note that, in the fourth impurity region 1222 and the fifth impurity region 1223, phosphorous (P) has been added in the preceding step (n$^{--}$ region), but the impurity element imparting p-type conductivity is added more than 10 times the concentration of phosphorous. Thus, the fourth impurity region 1222 has p-type conductivity. Here, the region having the same concentration range as the fourth impurity region 1222 is also referred to as a p$^+$ region.

Further, fifth impurity region 1223 is formed in regions overlapping the tapered portion of the first conductive layer 1215a, and is added with the impurity element imparting p-type conductivity in a concentration range of from $1 \times 10^{18}$ to $1 \times 10^{20}$/cm$^3$. Here, the region having the same concentration range as the fifth impurity region 1223 is also referred to as a p$^-$ region.

Through the above-described process, the impurity regions having n-type or p-type conductivity are formed in the respective semiconductor layers. The conductive layers 1214, 1215 become gate electrodes of TFTs.

Next, an insulating film 1224 that covers substantially the entire surface is fabricated. In this embodiment, a silicon oxide film is fabricated to have a thickness of 50 nm by plasma CVD. Of course, the insulating film is not limited to a silicon oxide film, and other insulating films containing silicon may be used in a single layer or a lamination structure.

Then, the process of activation treatment for the impurity element added to the respective semiconductor layers is carried out. In this activation process, a rapid thermal annealing (RTA) method using a lamp light source, a method for irradiating light emitted from a YAG laser or an excimer laser from the back surface, heat treatment using a furnace, or a combination thereof is employed.

Further, although an example in which the insulating film is fabricated before the activation is described in this embodiment, the insulating film may be fabricated after the activation is carried out.

Next, a first interlayer insulating film 1225 fabricated of a silicon nitride film is fabricated, and heat-treated at the temperature of from 300 to 550° C. for 1 to 12 hours, then, the process of hydrogenation of the semiconductor layers is carried out. The hydrogenation is carried out for terminating dangling bonds of the semiconductor layers by hydrogen contained in the first interlayer insulating film 1225. The semiconductor layers can be hydrogenated irrespective of the existence of an insulating film 1224 fabricated of a silicon oxide film. Incidentally, in this embodiment, a material containing aluminum as its main components is used for the second conductive layer, and thus, it is important that hydrogenation is carried out under the conditions of heat treatment that the second conductive layer can withstand. As another means for hydrogenation, plasma hydrogenation (using hydrogen excited by plasma) may be adopted.

Next, a second interlayer insulating film 1226 fabricated of an organic insulating material is fabricated over the first interlayer insulating film 1225. In this embodiment, an acrylic resin film with a thickness of 1.6 μm is fabricated. Then, contact holes that reach the respective impurity regions are formed. In this embodiment, a plurality of etching treatments is sequentially carried out. In this embodiment, the second interlayer insulting film 1226 is etched with the first interlayer insulating film 1225 as the etching stopper, and the first interlayer insulating film 1225 is etched with the insulating film 1224 as the etching stopper, and then, the insulating film 1224 is etched.

Thereafter, wirings 1227 to 1230 are formed by using Al, Ti, Mo, W, or the like.

Figure 13D:
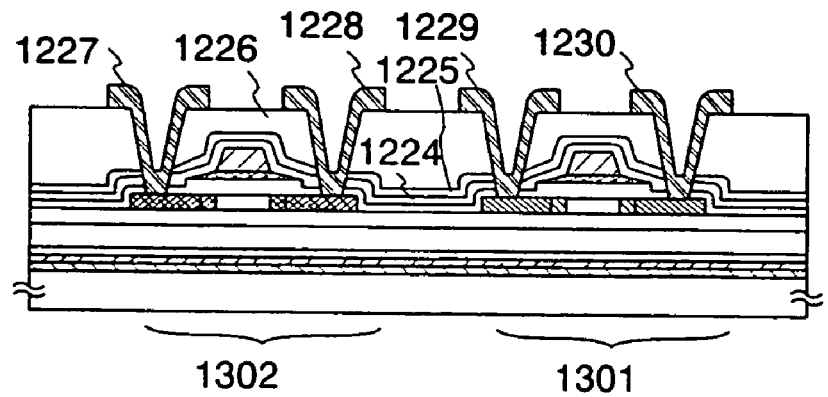

According to this, an n-channel TFT 1301 and a p-channel TFT 1302 are formed over one substrate (FIG. 13D).

Further, a CMOS circuit can be formed by connecting the n-channel TFT 1301 and the p-channel TFT 1302 to have a complementary structure.

In case of using a TFT that has the structure described in this embodiment in which the gate electrode and a part of an impurity region are overlapped with each other (GOLD structure), parasitic capacitance is increased due to the thin gate insulating film, however, if the parasitic capacitance is reduced by reducing the size of the part of the taper portion of a gate electrode (a first conductive layer), the frequency characteristics are improved, and higher speed operation and sufficient reliable TFT can be realized.

As described above, the process that is described in this embodiment mode of the present invention is carried out after the n-channel TFT 1301 and a p-channel TFT 1302 are formed over the substrate 1200 so that a semiconductor apparatus according to the present invention that has a structure in which a device formative layer including these TFTs covered by a fluoroplastic film can be manufactured.

The device formative layer including TFT fabricated according to this embodiment has a thickness at most 50 μm.

Embodiment 8

The state that the semiconductor chip according to the present invention is incorporated into a module and actually into an electric appliance will be described with reference to FIG. 14 using a cellular phone as an example.

Figure 14:
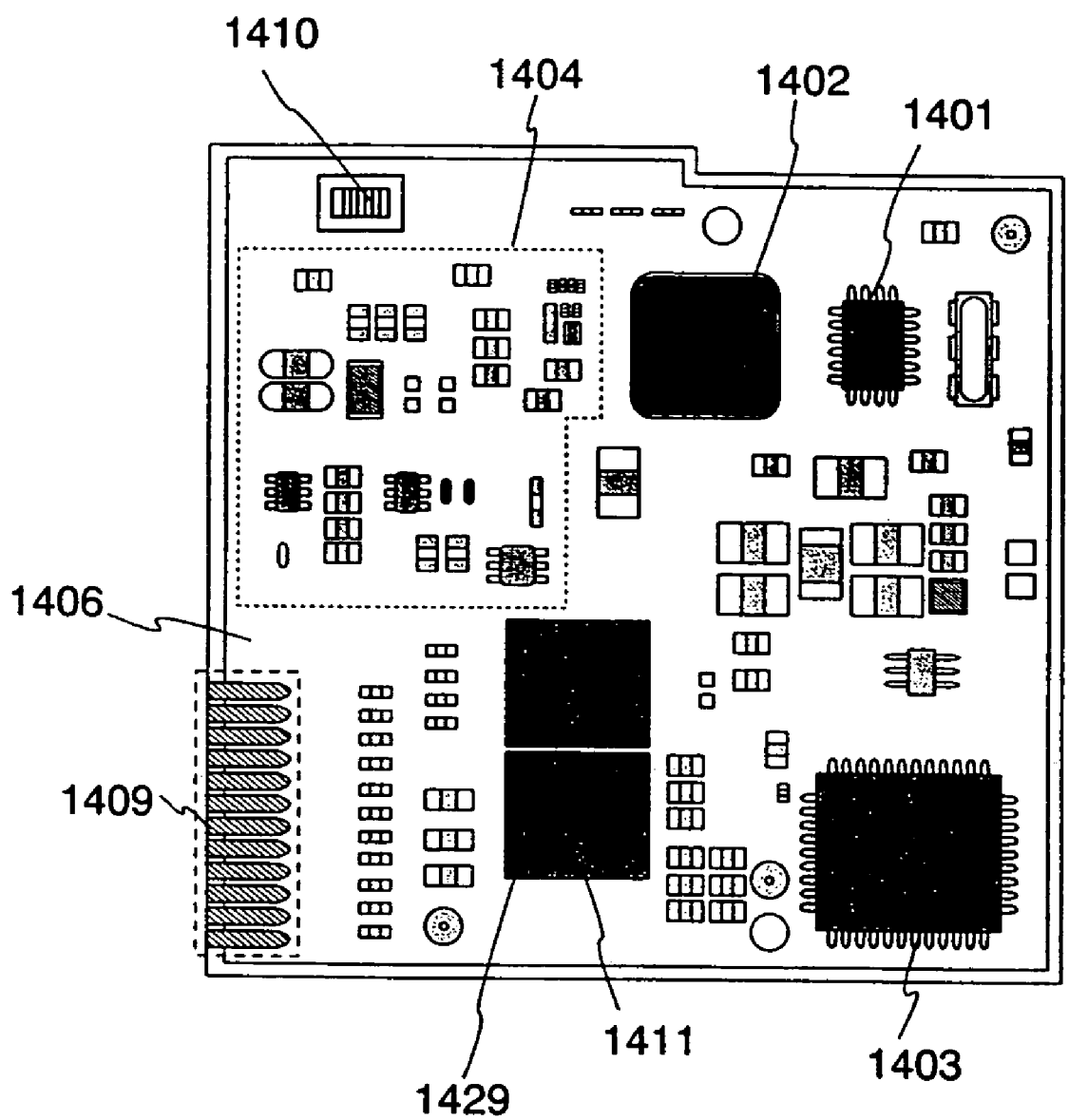
FIG. 14 is an explanatory view of a module incorporated with a semiconductor chip according to the present invention.

The module of a cellular phone shown in FIG. 14 is composed of a printed wiring board 1406 on which a controller 1401, a CPU 1402, a memory 1411, a power source circuit 1403, a speech processing circuit 1429, a transmitter-receiver circuit 1404, and a device such as a resister, a buffer, a capacitance device, or the like, are mounted. Though not shown, a panel is mounted on the printed wiring board 1406 by a FPC.

Various signals are inputted from a power source voltage, a keyboard, or the like into the printed wiring board 1406 via an interface (I/F) 1409 provided with a plurality of input terminals, which is used for a printed wiring board. A port for an antenna 1410 for transmitting and receiving signals to and from an antenna is provided for the printed wiring board 1406.

The memory 1411 includes a VRAM, a DRAN, a flush memory, or the like. An image date for displaying a panel is stored in the VRAM, an image data or a voice data is stored in the DRAM, and various programs are stored in the flush memory.

Power supply voltage for the controller 1401, the CPU 1402, the speech processing circuit 1429, the memory 1411, and the transmitter-receiver circuit 1404 is generated in the power source circuit 1403. According to the specification of a panel, a current source may be provided for the power source circuit 1403.

The structure of the CPU 1402 is described in Embodiment 4, and will not be further explained. The CPU transmit a signal including various instructions into the memory 1411, the transmitter-receiver circuit 1404, the speech processing circuit 1429, and the controller 1401.

The memory 1411, the transmitter-receiver circuit 1404, the speech processing circuit 1429, and the controller 1401 perform each operation by an instruction. Each the operation will be described hereinafter.

The signal inputted from a keyboard is transmitted into the CPU 1402 mounted over the printed wiring board 1406 via the interface 1409. In the CPU 1402, an image date stored in the VRAM is converted into a prescribed format in accordance with the signal transmitted from a keyboard and send to the controller 1401.

The image date send from the CPU 1402 is data-processed in accordance with the panel in the controller 1401, and supplied to the panel. In addition, the controller 1401 generates a Hsync signal, a Vsync signal, a clock signal CLK, and a volts alternating current (AC Cont) based on as power supply voltage inputted from the power source circuit 1403 or various signals inputted from CPU 1402, and supply theses signals to the panel.

In the transmitter-receiver circuit 1404, a signal which is transmitted and received to and from antenna as an electric wave is processed, specifically, a high frequency circuit such as an isolator, a band pass filter, a VCO (Voltage Controlled Oscillator), an LPF (Low Pass Filter), a coupler, and a balun are included. A signal among signals transmitted and received to and from the transmitter-receiver circuit 1404 is send to the speech processing circuit 1429 by an instruction of the CPU 1402.

A signal send by the instruction of the CPU 1402 is demodulated into a speech signal in the speech processing circuit 1429, and send to a speaker. A speech signal send from mike is modulated in the speech processing circuit 1429, and send to the transmitter-receiver circuit 1404 by an instruction of the CPU 1402.

The controller 1401, the CPU 1402, the power source circuit 1403, the speech processing circuit 1429, and the memory 1411 can be mounted as the semiconductor chip according to the present invention. The present invention can be applied to any circuit except the isolator, the band pass filter, the VCO (Voltage Controlled Oscillator), an LPF (Low Pass Filter), the coupler, and the balun.

Embodiment 9

Various modules as shown in Embodiment 8 can be completed by implementing the present invention. Thus, various modules can be completed by incorporating these modules thereinto.

Given as some examples of electronic appliances are: a video camera, a digital camera, a head mounting display (a goggle type display), a car navigation, a projector, a personal computer, a potable information terminal (an apparatus that can reproduce recording medium such as a mobile computer, a cellular phone, a mobile game machine, an electronic notebook, etc. and that can display images of these recording mediums), and the like. FIGS. 15A to 15G show specific example of the electric appliances.

Figure 15A:
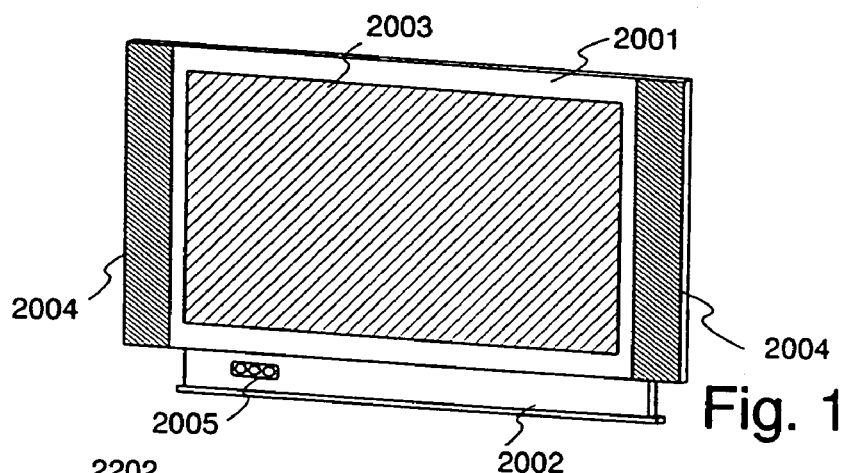
FIGS. 15A to 15G are explanatory views of electric appliances utilizing a semiconductor chip according to the present invention.

FIG. 15A shows a display including a frame 2001, a support 2002, a display screen unit 2003, a speaker 2004, a video input terminal 2005, and the like. The semiconductor chip according to the present invention can be used for a circuit unit or the like for displaying an image on the display. The display includes all information display apparatus such as an apparatus for a personal computer, a TV broadcasting, an advertisement, or the like.

Figure 15B:
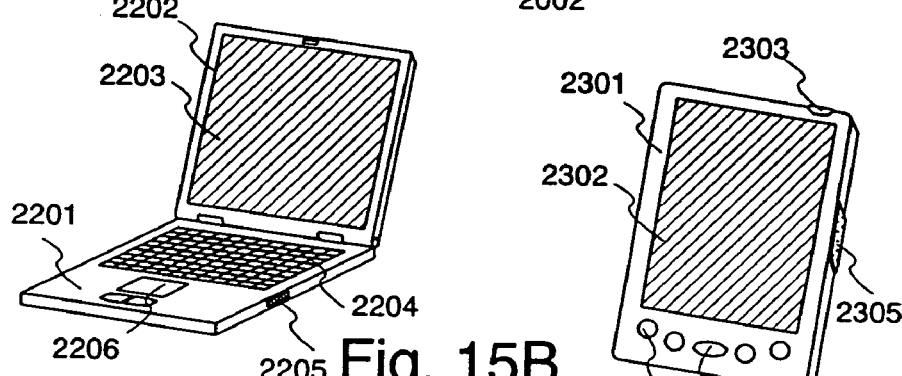

FIG. 15B shows a laptop computer including a main body 2201, a frame 2202, a display screen unit 2203, a keyboard 2204, an external connection port 2205, a pointing mouse 2206, and the like. The semiconductor chip according to the present invention can be used for a circuit unit or the like for driving the laptop computer.

Figure 15C:
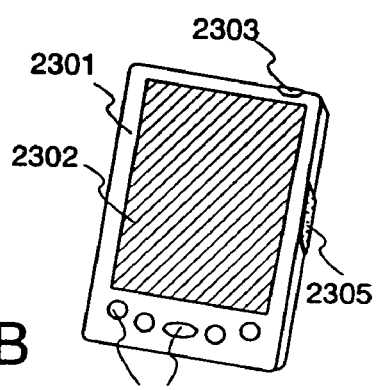

FIG. 15C shows a mobile computer including a main body 2301, a camera portion 2302, an operation switch 2303, a display screen unit 2304, an infrared port 2305, and the like. The semiconductor chip according to the present invention can be used for a circuit unit or the like for driving the mobile computer.

Figure 15D:
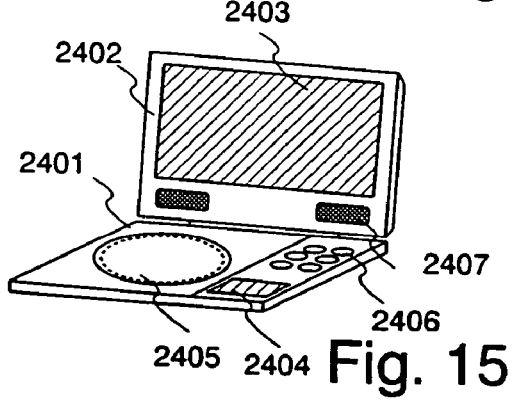

FIG. 15D shows a player using a record medium recorded with programs (hereinafter, a record medium) including a main body 2401, a frame 2402, a display screen unit A 2403, a display screen unit B 2404, a read-in unit 2405, operation keys 2406, a speaker unit 2407, and the like. The player uses DVD (Digital Versatile Disc), CD or the like as a record medium and can enjoy music, enjoy movie and carry out game or Internet.

Figure 15E:
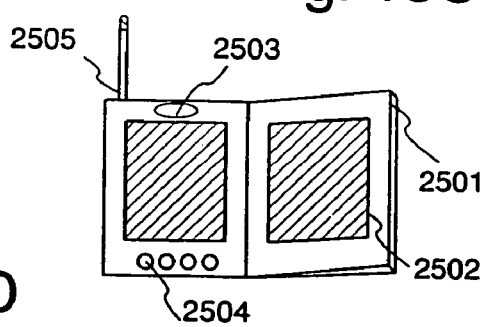

FIG. 15E shows a portable book (electronic book) including a main body 2501, display portion 2502, a record medium 2503, an operation switch 2504, an antenna 2505, and the like. The semiconductor chip according to the present invention can be used for a circuit unit or the like for operating the portable book.

Figure 15F:
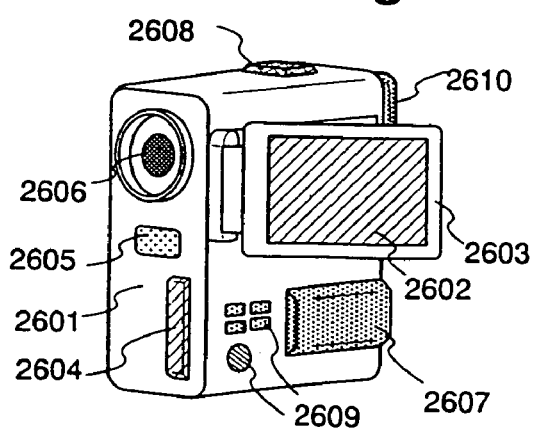

FIG. 15F shows a video camera including a main body 2601, a display screen unit 2602, a frame 2603, an external connection port 2604, a remote control receiving portion 2605, an image receiving portion 2606, a voice input portion 2608, operation switches 2609, an eye piece portion 2610, and the like. The semiconductor chip according to the present invention can be used for a circuit unit or the like for operating the video camera.

Figure 15G:
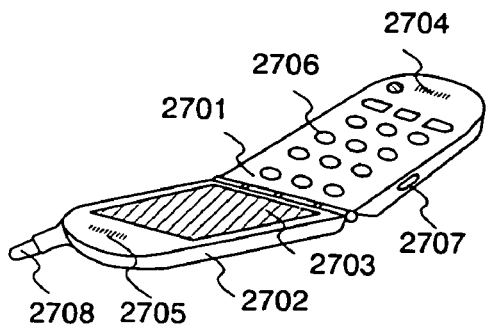

FIG. 15G shows a cellular phone including a main body 2701, a frame 2702, a display screen unit 2703, a sound input portion 2704, a sound output portion 2705, an operation key 2706, an external connection port 2707, an antenna 2708, and the like. The semiconductor chip according to the present invention can be used for a circuit unit or the like for operating the cellular phone.

As has been described, the range of applying the light-emitting apparatus according to the present invention is extremely wide and the semiconductor apparatus according to the present invention is applicable to electric appliances of all the fields.

By implementing the present invention, a semiconductor chip which is integrated by stacking a plurality of device formative layer with at most 50 μm can be provided. Moreover, device destruction due to heat or the like which is occurred in case that the semiconductor chip is formed into a thin film can be prevented by using a material having great thermal conductive property for a substrate to which a device formative layer is transferred and an interface on which a device formative layer is stacked.

What is claimed is:

1. A semiconductor chip comprising:
   a first device formative layer with a thickness of at most 50 μm provided over a thermal conductive substrate via a first adhesive layer;
   a thermal conductive film formed on the first device formative layer; and
   a second device formative layer with a thickness of at most 50 μm formed over the thermal conductive film via a second adhesive layer.

2. The semiconductor chip according to claim 1, wherein the first device formative layer and the second device formative layer have thicknesses of from 0.1 to 10 μm.

3. The semiconductor chip according to claim 1, wherein the thermal conductive substrate is formed of one of a ceramic material containing aluminum oxide, aluminum nitride, aluminum nitride oxide, or silicon nitride as its main components, and a graphite material containing carbon as its main components.

4. The semiconductor chip according to claim 1, wherein the thermal conductive film comprises at least one selected from the group consisting of aluminum nitride, aluminum nitride oxide, boron phosphide, boron nitride, and diamond like carbon.

5. The semiconductor chip according to claim 1, wherein at least one of the first device formative layer and the second device formative layer comprises at least one selected from the group consisting of a TFT, a CPU including TFTs, an MPU, a memory and a light-emitting apparatus.

6. An electric device having the semiconductor chip according to claim 1.

7. The electric device according to claim 6, wherein the electric device is one selected from the group consisting of a video camera, a digital camera, a head mounting display, a car navigation, a projector, a personal computer and a potable information terminal.

8. A semiconductor chip comprising:
   a first device formative layer with a thickness of at most 50 μm provided over a thermal conductive substrate via a first adhesive layer;
   a thermal conductive film formed on the first device formative layer; and
   a second device formative layer with a thickness of at most 50 μm formed over the thermal conductive film via a second adhesive layer,
   wherein each of the first device formative layer and the second device formative layer is electrically connected to the thermal conductive substrate by a connection wire.

9. The semiconductor chip according to claim 8, wherein the first device formative layer and the second device formative layer have thicknesses of from 0.1 to 10 μm.

10. The semiconductor chip according to claim 8, wherein the thermal conductive substrate is formed of one of a ceramic material containing aluminum oxide, aluminum nitride, aluminum nitride oxide, or silicon nitride as its main components, and a graphite material containing carbon as its main components.

11. The semiconductor chip according to claim 8, wherein the thermal conductive film comprises at least one selected from the group consisting of aluminum nitride, aluminum nitride oxide, boron phosphide, boron nitride, and diamond like carbon.

12. The semiconductor chip according to claim 8, wherein at least one of the first device formative layer and the second device formative layer comprises at least one selected from the group consisting of a TFT, a CPU including TFTs, an MPU, a memory and a light-emitting apparatus.

13. An electric device having the semiconductor chip according to claim 8.

14. The electric device according to claim 13, wherein the electric device is one selected from the group consisting of a video camera, a digital camera, a head mounting display, a car navigation, a projector, a personal computer and a potable information terminal.

15. A semiconductor chip comprising:
a first device formative layer with a thickness of at most 50 μm provided over a thermal conductive substrate via a first adhesive layer;
a thermal conductive film formed on the first device formative layer; and
a second device formative layer with a thickness of at most 50 μm formed over the thermal conductive film via a second adhesive layer,
wherein a first semiconductor device included in the first device formative layer and a second semiconductor device included in the second device formative layer are electrically connected via the second adhesive layer by a first wiring included in the first device formative layer and an auxiliary wiring connected electrically to a second wiring included in the second formative layer.

16. The semiconductor chip according to claim 15, wherein the first device formative layer and the second device formative layer have thicknesses of from 0.1 to 10 μm.

17. The semiconductor chip according to claim 15, wherein the second adhesive layer contains an anisotropic conductive material.

18. The semiconductor chip according to claim 15, wherein the thermal conductive substrate is formed of one of a ceramic material containing aluminum oxide, aluminum nitride, aluminum nitride oxide, or silicon nitride as its main components, and a graphite material containing carbon as its main components.

19. The semiconductor chip according to claim 15, wherein the thermal conductive film comprises at least one selected from the group consisting of aluminum nitride, aluminum nitride oxide, boron phosphide, boron nitride, and diamond like carbon.

20. The semiconductor chip according to claim 15, wherein at least one of the first device formative layer and the second device formative layer comprises at least one selected from the group consisting of a TFT, a CPU including TFTs, an MPU, a memory and a light-emitting apparatus.

21. An electric device having the semiconductor chip according to claim 15.

22. The electric device according to claim 21, wherein the electric device is one selected from the group consisting of a video camera, a digital camera, a head mounting display, a car navigation, a projector, a personal computer and a potable information terminal.

* * * * *